(12) United States Patent
Chen

(10) Patent No.: US 9,679,849 B1
(45) Date of Patent: Jun. 13, 2017

(54) 3D NAND ARRAY WITH SIDES HAVING UNDULATING SHAPES

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/096,785

(22) Filed: Apr. 12, 2016

(51) Int. Cl.
| | |
|---|---|
| *H01L 27/115* | (2017.01) |
| *H01L 23/528* | (2006.01) |
| *G11C 16/04* | (2006.01) |
| *G11C 16/08* | (2006.01) |
| *G11C 16/34* | (2006.01) |
| *H01L 27/1157* | (2017.01) |
| *H01L 27/11582* | (2017.01) |
| *H01L 23/522* | (2006.01) |
| *H01L 21/768* | (2006.01) |

(52) U.S. Cl.
CPC ...... *H01L 23/5283* (2013.01); *G11C 16/0483* (2013.01); *G11C 16/08* (2013.01); *G11C 16/3427* (2013.01); *H01L 21/76816* (2013.01); *H01L 21/76877* (2013.01); *H01L 23/5226* (2013.01); *H01L 27/1157* (2013.01); *H01L 27/11582* (2013.01)

(58) Field of Classification Search
CPC ........... H01L 27/11565; H01L 27/1157; H01L 27/11582; G11C 16/0466; G11C 16/0483
See application file for complete search history.

(56) References Cited

U.S. PATENT DOCUMENTS

| | | | |
|---|---|---|---|
| 6,906,940 B1 | 6/2005 | Lue | |
| 6,933,556 B2 * | 8/2005 | Endoh | H01L 27/115 257/314 |
| 7,315,474 B2 | 1/2008 | Lue | |
| 7,420,242 B2 | 9/2008 | Lung | |
| 7,696,559 B2 | 4/2010 | Arai et al. | |
| 7,851,849 B2 | 12/2010 | Kiyotoshi | |
| 8,008,732 B2 | 8/2011 | Kiyotoshi et al. | |

(Continued)

FOREIGN PATENT DOCUMENTS

| | | |
|---|---|---|
| EP | 2048709 A2 | 4/2009 |
| TW | 201436193 A | 9/2014 |

OTHER PUBLICATIONS

Bae, JH, "Samsung's 3D V-NAND breaks through chip scaling limits", http://itersnews.com, dated Feb. 14, 2014, 5 pages.

(Continued)

*Primary Examiner* — Allison P Bernstein
(74) *Attorney, Agent, or Firm* — Haynes Beffel & Wolfeld LLP

(57) ABSTRACT

Area overhead is reduced between adjacent blocks of a 3D vertical channel memory device. In various embodiments, vertically oriented pillars that intersect layers of string select lines and word lines are arranged at intersections of a regular grid that is rotated, in a "twisted" array of pillars. Sides of shapes of the 3D NAND array structure are undulating, and follow undulating lines in which the outer pillars are disposed. For example, any of the string select lines, word lines, ground select lines, and ground lines have sides with undulating shapes.

20 Claims, 13 Drawing Sheets

(56) References Cited

U.S. PATENT DOCUMENTS

| | | | |
|---|---|---|---|
| 8,154,068 B2* | 4/2012 | Katsumata | H01L 27/0688 257/314 |
| 8,363,476 B2 | 1/2013 | Lue et al. | |
| 8,467,219 B2 | 6/2013 | Lue | |
| 8,503,213 B2 | 8/2013 | Chen et al. | |
| 8,648,438 B2 | 2/2014 | Cai et al. | |
| 8,759,899 B1 | 6/2014 | Lue et al. | |
| 8,853,818 B2 | 10/2014 | Lue | |
| 9,147,468 B1 | 9/2015 | Lue | |
| 9,219,073 B2 | 12/2015 | Chen | |
| 9,219,074 B2 | 12/2015 | Chen | |
| 9,391,084 B2 | 7/2016 | Lue | |
| 9,455,267 B2* | 9/2016 | Zhang | H01L 23/528 |
| 2005/0280061 A1 | 12/2005 | Lee | |
| 2007/0045708 A1 | 3/2007 | Lung | |
| 2007/0158736 A1 | 7/2007 | Arai et al. | |
| 2007/0252201 A1 | 11/2007 | Kito et al. | |
| 2008/0073635 A1 | 3/2008 | Kiyotoshi et al. | |
| 2008/0175032 A1 | 7/2008 | Tanaka et al. | |
| 2008/0180994 A1 | 7/2008 | Katsumata et al. | |
| 2009/0097321 A1 | 4/2009 | Kim et al. | |
| 2009/0184360 A1 | 7/2009 | Jin et al. | |
| 2010/0270593 A1 | 10/2010 | Lung et al. | |
| 2011/0018051 A1 | 1/2011 | Kim et al. | |
| 2012/0007167 A1 | 1/2012 | Hung et al. | |
| 2012/0068241 A1 | 3/2012 | Sakuma et al. | |
| 2012/0119283 A1 | 5/2012 | Lee et al. | |
| 2012/0182806 A1 | 7/2012 | Chen et al. | |
| 2014/0140131 A1 | 5/2014 | Yeh et al. | |
| 2015/0105639 A1 | 4/2015 | Watanabe | |
| 2015/0206896 A1 | 7/2015 | Chen | |
| 2015/0206898 A1 | 7/2015 | Chen | |
| 2015/0206899 A1 | 7/2015 | Chen | |

OTHER PUBLICATIONS

Chen, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

Chen, et al., "Highly Scalable Vertical Gate 3-D NAND", 2012 IEEE International Electron Devices Meeting (IEDM), Feb. 4, 2013, 9 pages.

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Das, Arabinda, "Samsung 2x nm LPDDR3 DRAM Scales Memory Wall", EE Times, http://www.eetimes.com/author.asp?section id+36&eoc id+1321629&print=yes, dated Mar. 25, 2014, 6 pages.

Erh-Kun Lai et al. "A Multi-Layer Stackable Thin-Film Transistor (TFT) NAND-Type Flash Memory," IEDM Aug. 2006, consisting of 4 pages.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung, et al., "A highly scalable vertical gate (VG) 3D NAND Flash with robust program disturb immunity using a novel PN diode decoding structure," 2011 Symp. on VLSI Technology (VLSIT), Jun. 14-16, 2011, 2 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE), " IEEE 2008 Symposium on VLSI Technology Digest of Technical Papers, Jun. 17-19, 2008, pp. 122-123.

Komori, et al., "Disturbless Flash Memory due to High Bloost Efficiency on BiCS Structure and Optimal Memory Film Stack for Ultra High Density Storage Device", Electron Devices Meeting, IEDM 2008, IEEE International, Dec. 15-17, 2008, San Francisco, California, 4 pages.

Lai et al., "A Multi-Layer Stackable Thin-Film Transistor (TFT) NAND-Type Flash Memory," IEEE Int'l Electron Devices Meeting, Dec. 11-13, 2006, 4 pages.

Lue, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

Nowak, et al., "Intrinsic fluctuations in Vertical NAND flash memories," VLSI Technology (VLSIT), 2012 Symposium on , vol., no., pp. 21,22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 14/637,187—entitled "Vertical Thin-Channel Memory ," by Hang-Ting Lue, filed Mar. 3, 2015, 90 pages.

U.S. Appl. No. 14/637,204 entitled "U-Shaped Vertical Thin-Channel Memory," by Hang-Ting Lue, filed Mar. 3, 2015, 78 pages.

Wang, Michael, "Technology Trends on 3D-NAND Flash Storage", Impact 2011, Taipei, dated Oct. 20, 2011, found at 222.impact.org.tw/2011/files/newsfile/201111110190.pdf.

* cited by examiner

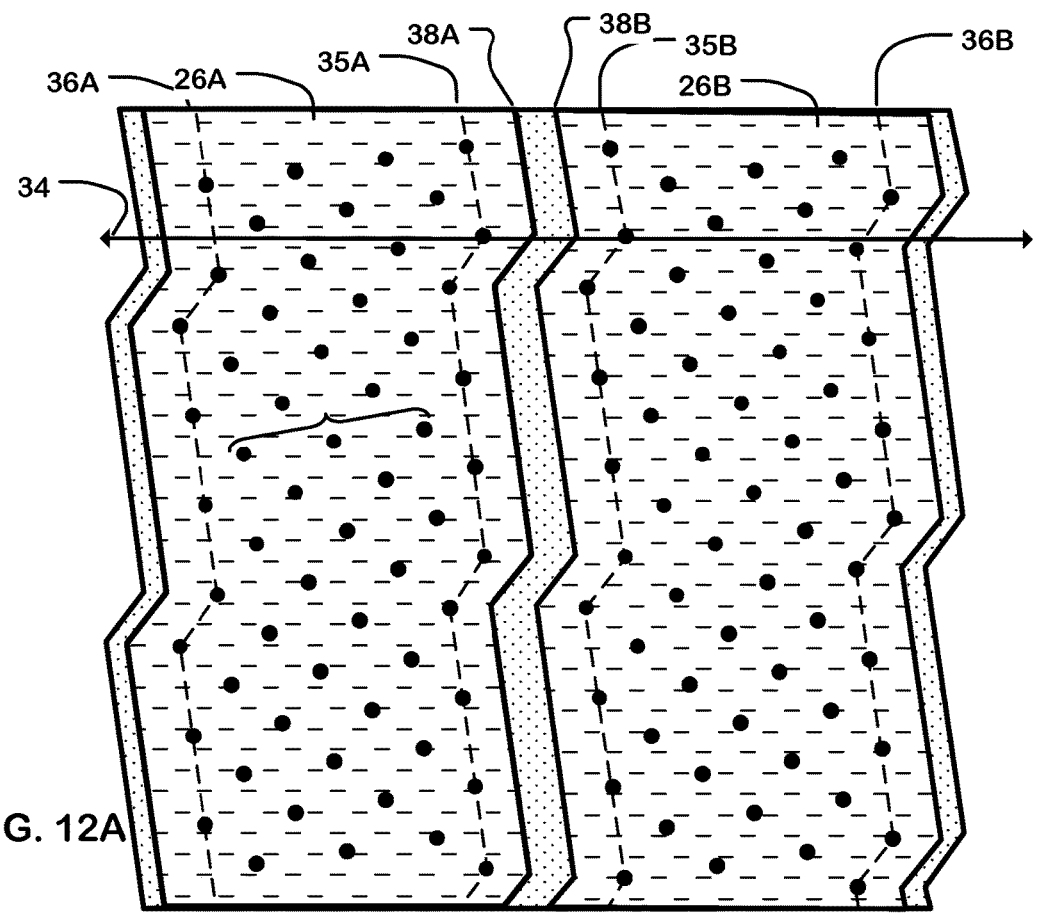
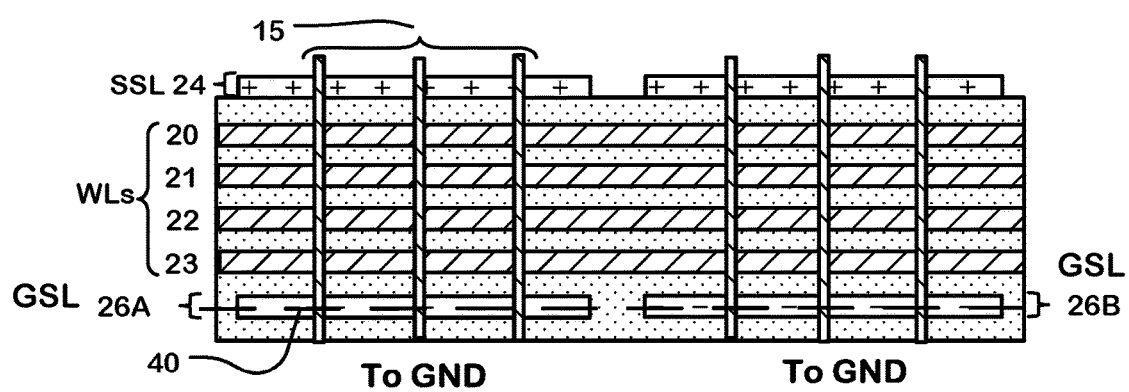

US 9,679,849 B1

3D NAND ARRAY WITH SIDES HAVING UNDULATING SHAPES

CROSS-REFERENCE TO OTHER APPLICATIONS

This application is related to each of the following U.S. patent applications, all owned by the same assignee and having the same inventor:

U.S. Pat. No. 9,219,074, issued 22 Dec. 2015, application Ser. No. 14/157,550, filed 17 Jan. 2014, entitled Three-Dimensional Semiconductor Device, incorporated by reference herein. (Also published as US 2015/0206896 on 23 Jul. 2015).

U.S. Pat. No. 9,219,073, issued 22 Dec. 2015, application Ser. No. 14/582,848, filed 24 Dec. 2014, entitled Parallelogram Cell Design For High Speed Vertical Channel 3D NAND Memory, incorporated by reference herein. (Also published as US 2015/0206898 on 23 Jul. 2015).

U.S. Publication No. 2015/0206899, published 23 Jul. 2015, application Ser. No. 14/582,963, filed 24 Dec. 2014, entitled Twisted Array Design For High Speed Vertical Channel 3D NAND Memory, incorporated by reference herein.

U.S. application Ser. No. 14/640,869, filed 6 Mar. 2015, entitled Separated Lower Select Line In 3D NAND Architecture, incorporated by reference herein.

U.S. application Ser. No. 14/857,651, filed 17 Sep. 2015, entitled 3D NAND Array Architecture, incorporated by reference herein.

BACKGROUND

Field of the Invention

The present invention relates to high density memory devices, and particularly to memory devices in which multiple layers of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006, incorporated by reference herein.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a vertical NAND gate, using dielectric charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a gate-all-around cell at each layer.

FIG. 1 and FIG. 2 are respectively a top view and a side view of a pipe-shaped column of flash cells. Referring to the top view in FIG. 1, a bit line (hashed outline 8) is connected to an interlayer conductor 9, which in turn contacts a contact pad 10 on top of a vertical channel pillar 15. The contact pad 10 in this illustration obscures the core of the vertical channel pillar 15, but shows in cross section the dielectric charge trapping structure comprising for example a first layer 16 of silicon oxide, a layer 17 of silicon nitride and a second layer 18 of silicon oxide (referred to as ONO), or another multilayer dielectric charge trapping structure, which surrounds the cylindrical shell 14 of semiconductor material. The pillar 15 is characterized by a cell diameter "a" which is the outer diameter of the outer second layer 18 of the dielectric charge trapping structure of the pillar 15. In the top view of FIG. 1, a string select strip 24 is shown contacting the outer second layer 18 of the dielectric charge trapping structure. A string select gate is thus established for the pillar.

Referring to the side view in FIG. 2, the contact pad 10 overlies the core of the pillar 15, including a cylindrical shell 14 of semiconductor material. The cylindrical shell 14 of semiconductor material extends vertically through layers of conductive strips, including the string select strip 24, a multilevel stack of conductive strips configured as word line conductive strips 20-23, and ground select strip 25 in the bottom layer. The cylindrical shell 14 of conductive semiconductor material has an insulating core 11 inside in this example. Alternatively the core inside the cylindrical shell has metal material. Alternatively the conductive semiconductor material is a solid cylinder of semiconductor material. The dielectric charge trapping structure comprising for example a first layer 16 of silicon oxide, a layer 17 of silicon nitride and a second layer 18 of silicon oxide (referred to as ONO), or another multilayer dielectric charge trapping structure, surrounds the cylindrical shell 14 of semiconductor material. The pillar 15 is characterized by a cell diameter "a" which is the outer diameter of the outer dielectric of the pillar 15. The outer second layer 18 of the dielectric charge trapping structure is in contact with the conductive layers 20-23 configured as word lines, resulting in memory cells at the cross points. The bottom conductive strip 25 configured as a ground select line also contacts the outer second layer 18 of the dielectric charge trapping structure in this example. In some embodiments, the dielectric between one or both of the string select strip 24 and the ground select strip 25 is different than the dielectric charge trapping structure.

As illustrated in the top view of FIG. 1, string select line SSL strip 24 is intersected by the pillar 15, such that string select line SSL strip 24 is an all-around gate. Below the string select line SSL strip 24, layers of word line strips WLs 20-23 are each intersected by the pillar 15, each also an all-around gate. A frustum of the pillar 15 combines with each of the word lines WLs 20-23 to form a memory cell at each layer. Below the word lines WLs 20-23 ground select line GSL 25 also is intersected by pillar 15.

Accordingly, a NAND string is formed on the current path through the cylinder of semiconductor material, between the bit line conductor BL 8 and the ground GND below the cylinder of semiconductor material (not shown).

FIG. 3 is a perspective view of a 3D semiconductor device. It comprises a multilevel stack of word line conductive strips 20-23 over a substrate (not shown); a plurality of pillars 15 extends through the stack, each of the pillars 15 comprising channels of a plurality of series-connected memory cells located at cross-points between the pillars 15 and the word line conductive layers 20-23 and a plurality of string select lines (SSLs) 24 in a string select line layer above the word line conductive layers 20-23, each of the string select lines intersecting a respective row of the pillars 15. Each intersection of a pillar 15 and a string select line 24 defines a string select gate (SSG) of the pillar. The structure also includes ground select lines GSL strip 25A, 25B oriented parallel to the substrate and forming a layer below the word line conductive layers 20-23. A common source line (CSL) 27 is formed in a layer parallel to the substrate and below the GSLs 25A, 25B. Each intersection of a pillar 15 and a ground select line 25 defines a ground select gate (GSG) of the pillar. The pillars in the plurality of pillars that share GSL line 25A can be coupled to the common source line 27, and therefore selected for operation using the GSL strip 25A. Likewise, the pillars in the plurality of pillars that share GSL line 25B can be coupled to the common source line 27, and therefore selected for operation using the GSL strip 25B. The structure also includes a plurality of parallel bit line conductors 8 in a layer parallel to the substrate and above the string select lines 24. Each of the bit line conductors 8 overlies a respective column of the pillars 15, and each of the pillars 15 underlies one of the bit line conductors 8. The pillars 15 may be constructed as described above with respect to FIGS. 1 and 2. The group of pillars, coupled to a single SSL line in this configuration, is arranged in a line perpendicular to the bit line direction, and includes one pillar per bit line, and each bit line is coupled to one pillar in each group of pillars.

As shown in FIG. 3, a typical arrangement has a stepped contact structure to the word line conductive layers. Deep etches are made through the structure in order to form contacts to connect the conductive layers to metal interconnects above. In a typical design, the number of rows of pillars in a block is at least as great as the number of contacts, and hence memory layers. See, for example, Komori, Y., et al., "Disturbless flash memory due to high boost efficiency on BiCS structure and optimal memory film stack for ultra high density storage device," IEEE Int'l Electron Devices Meeting, pp. 1-4, 15-17 Dec. 2008, incorporated herein by reference.

The layout of the memory structure therefore can expand with the overhead of connections to the stacks of conductors, and the relatively large diameter of the vertical channel pillars. This large overhead is a limit on bit density in 3D memory.

An opportunity therefore arises to create robust solutions to the problem of increasing bit density of 3D memory structures while reducing the negative impacts that such increases tend to cause. Better chip yields, and denser, and more powerful circuits, components and systems may result.

SUMMARY

A memory device is described, comprising an array of vertical NAND strings disposed below a set of bit line conductors, the bit line conductors extending in a bit line direction. String select lines and word lines of the vertical NAND strings comprise conductive strips configured in layers. Vertical NAND strings in the array extend through the layers of conductive strips. NAND strings in a given subset of the array page being coupled with the conductive strip of a corresponding single string select line, such subsets being referred to herein as a page of NAND strings. The NAND strings in each page being disposed in a grid that is tilted by an off-angle relative to the bit line direction. The conductive strips of the string select lines have curved sides. Also, the conductive strips of the plurality of word lines and the conductive strips of the ground select lines can have curved sides. The curved sides enable dense layout of blocks of NAND strings that can comprise many pages, which are disposed in tilted grids.

The NAND strings in each page can be disposed in a regular grid that is tilted relative to the bit line direction. The regular grid in each page can have a regular pitch in a direction tilted from the bit line direction. The regular grids of first and second adjacent pages can be offset from the regular pitch. The offsets can be made in one or both of the bit line direction and a direction perpendicular to the bit line direction.

The above summary of the invention is provided in order to provide a basic introduction of some aspects of the technology described herein. This summary is not intended to identify key or critical elements of the invention or to delineate the scope of the invention. Its sole purpose is to present some concepts in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIGS. 12A and 12B respectively illustrate a top view and a side view of an implementation of a 3D memory device using a vertical channel structure, where the top view shows ground select lines.

DETAILED DESCRIPTION

Figure 1:
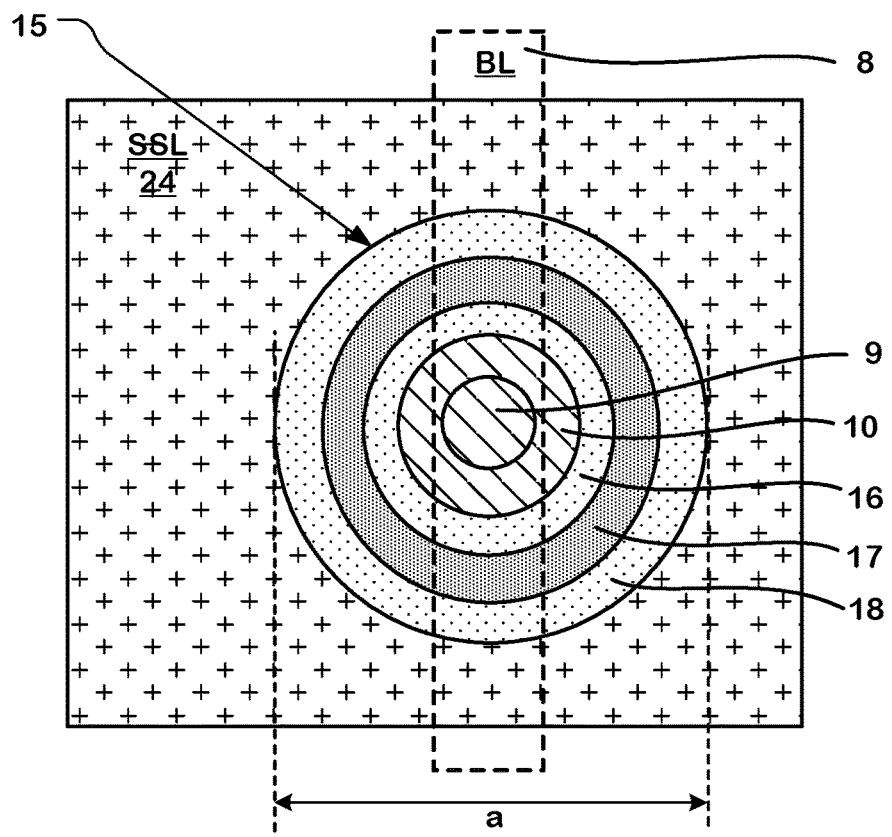
FIG. 1 and FIG. 2 are respectively a top view and a side view of a pipe-shaped column of flash cells.

One solution to the problem of increasing bit density of 3D memory structures while reducing the negative impacts that such increases tend to cause, was discussed in the above-incorporated U.S. Application Publication 2015/0206899, which describes a "twisted array" structure. As described in more detail therein, in a memory device having a multilevel stack of conductive layers oriented parallel to a substrate, pillars oriented orthogonally to the substrate each include series-connected memory cells at cross-points between the pillars and the conductive layers. String select lines (SSLs) are disposed above the conductive layers, each intersection of a pillar and an SSL defining a respective select gate of the pillar. Bit line conductors are disposed above the string select lines. The pillars in the plurality of pillars are arranged on a regular grid which is rotated relative to the bit line conductors. The grid may have a square, rectangle or diamond-shaped unit cell, and may be rotated relative to the bit line conductors by an angle θ where tan(θ)=±X/Y, where X and Y are co-prime integers. The SSLs may be made wide enough so as to intersect two pillars on one side of the unit cell, or all pillars of the cell, or sufficiently wide as to intersect pillars in two or more non-adjacent cells. The rotation permits a higher density of bit line conductors, thereby enabling a higher data rate due to increased parallel operation. It also enables a smaller number of SSLs, thereby reducing read disturbance, reducing power consumption and further improving data rate by reducing unit cell capacitance.

Another solution to the above problem was discussed in the above-incorporated, U.S. Pat. No. 9,219,073, which describes a "parallelogram cell" structure, which we refer to herein also as a twisted array. As described in more detail therein, instead of being arranged on a rotated grid, the pillars in the plurality of pillars are arranged on a regular grid having a unit cell which is a non-rectangular parallelogram. The pillars may be arranged so as to define a number of parallel pillar lines, the pillar lines having an acute angle θ>0° of intersection with the bit line conductors, each line of pillars having exactly n>1 pillars all intersecting a particular common one of the string select lines. As with the twisted array design, the parallelogram array design also permits a higher density of bit line conductors, thereby enabling a higher data rate due to increased parallel operation. It also enables a smaller number of SSLs, thereby reducing disturbance, reducing power consumption and further improving data rate by reducing unit cell capacitance.

In both of the above solutions, the described benefits are obtained in part because the SSLs can be made significantly wider in the bit line dimension than in conventional arrays. There are limits, however, because the intersections between an SSL and a bit line should uniquely define exactly one of the pillars. If the SSLs are too wide in the bit line direction, then more than one pillar underlying a single bit line may also underlie the SSL, thereby creating an addressing conflict. If the SSLs are too narrow in the bit line direction, then some bit line conductors may cross the SSL without intersecting any of the pillars.

The layout of the SSL conductive strips which are generally orthogonal to the bit line conductors, and of the stacks of conductive strips underneath the SSL in twisted array layouts which lie on grids disposed at off-angles, must account for manufacturing and performance margins for the pillars closest to the sides of the SSL conductive strips. Thus, overhead in the layout of the blocks of pillars coupled to a single SSL conductive strip is introduced to account for these margins.

Figure 4A:
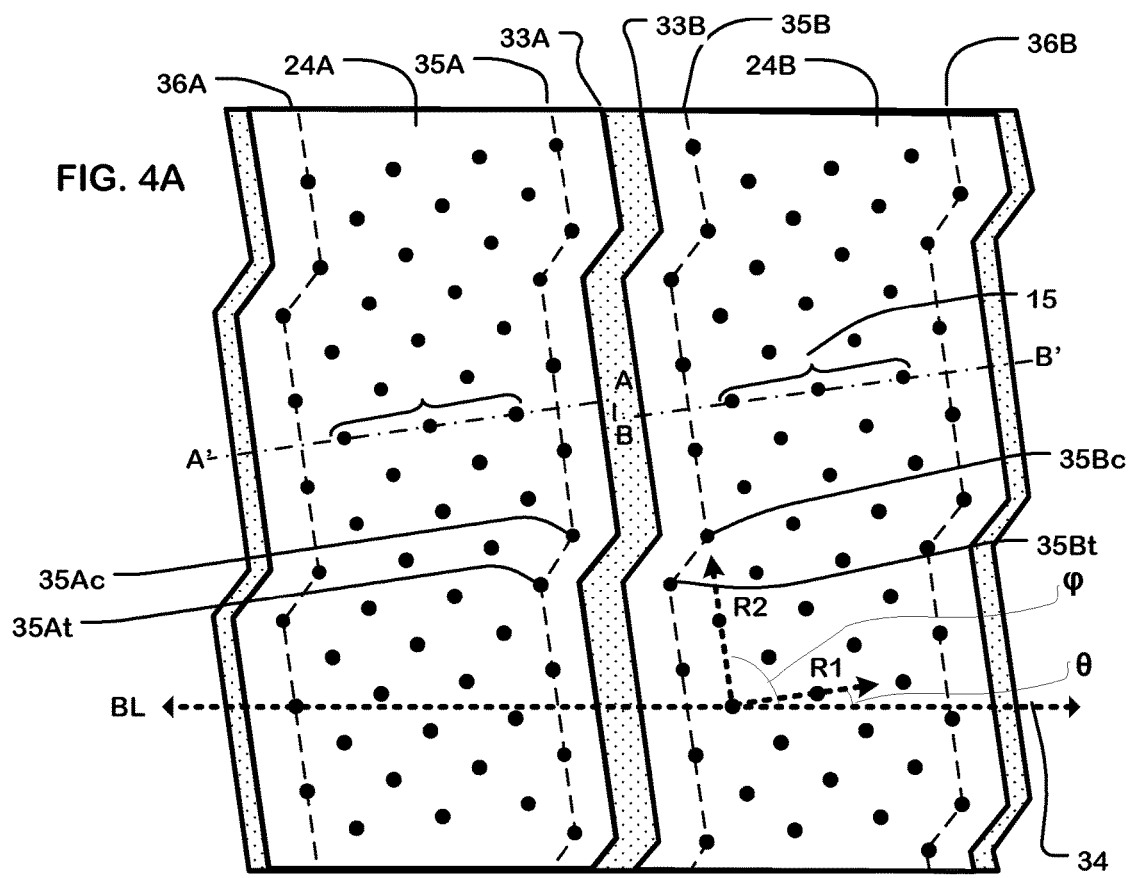
FIGS. 4A and 4B respectively illustrate a top view and a side view of an implementation of a 3D memory device using a vertical channel structure, where the top view shows the string select lines.
Figure 4B:
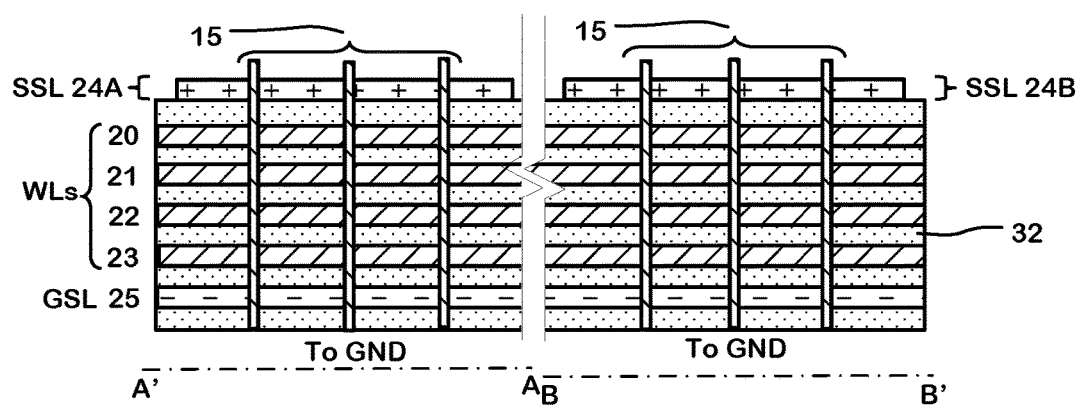

FIGS. 4A and 4B respectively illustrate a top view and a side view of an implementation of a 3D memory device using a vertical channel structure, where the top view shows conductive strips 24A, 24B configured as adjacent SSL lines with respective blocks of pillars arranged in twisted arrays. FIG. 4B is a side view of the cross-section through the line segments A-A' and B-B', which lines together lie on the zig-zag line in the top view of FIG. 4A. FIG. 4B shows the cross-section of line segment A-A', adjacent to the cross-section of line segment B-B'. The memory device includes a plurality of stacks of conductive layers alternating with insulating layers on an integrated circuit substrate. The stacks of conductive layers include at least a bottom conductive layer with ground select line GSL strip 25, a plurality of intermediate conductive layers of word lines (WLs) 20-23, and a top conductive layer with string select lines (SSLs) 24. Pillars 15 intersect the stacks of conductive layers.

Although 4 layers are shown for the layers of word line conductive strips 20-23, in other embodiments the layers of word lines include any number of layers, such as 8, 16, or 32 layers. Similarly, the number of pillars, string select lines, ground select lines, and/or ground lines is different in other embodiments.

Pillars 15 of vertical channel structures are arranged orthogonally to the plurality of stacks and intersect the conductive layers in the stacks. Memory elements are disposed in interface regions at cross-points between side surfaces of the plurality of stacks and the plurality of pillars 15.

Referring to the layout view in FIG. 4A, the block of pillars that intersects the SSL conductive strip 24A and the block of pillars that intersects the SSL conductive strip 24B are configured in twisted arrays. In this example, the twisted array in each block comprises a regular grid, each respective regular grid having two lateral dimensions R1 and R2 that are rotated by respective acute off-angle θ and obtuse off-angle φ relative to the bit line direction 34, and having lateral pitches on the two lateral dimensions, so that the bit line pitch as discussed below is less than the lateral pitch of the pillars in the obtuse off-angle lateral dimension R2, and also less than the lateral pitch of the pillars in the acute off-angle lateral dimension R1. In preferred embodiments, the acute off-angles θ and obtuse off-angles φ in the blocks in a plurality of blocks coupled along a common plurality of bit line conductors are the same. Embodiments can be implemented in which the acute off-angles θ and obtuse off-angles φ may vary among the blocks. Other embodiments have a different number of pillars, different regular grid defining pillar locations, and/or a different number of bit line conductors.

As shown, the first page of pillars which intersects the SSL conductive strip 24A includes a first outer set of pillars disposed in a first undulating line 35A crossing the bit line direction resulting from the off-angles, and the first string select strip 24A has a first side 33A between the first and second string select strips 24A, 24B with a first undulating shape following the first undulating line 35A.

Also, the second page of pillars includes a second outer set of pillars disposed in a second undulating line 35B crossing the bit line resulting from the off-angles in a generally orthogonal direction, and the second string select strip 24B has a second side 33B between the first and second string select strips with a second undulating shape following the second undulating line 35B crossing the bit line resulting from the off-angles in a generally orthogonal direction. The undulating lines 35A, 35B in this example are composed of straight segments between adjacent pillars in the set of outer pillars on the respective blocks. The sides 33A and 33B follow the undulating lines by being equidistant from the straight segments. In other embodiments the undulating shapes of the sides of the conductive strips are not formed of straight segments, but can be formed of curved segments, or a combination of curved and straight segments, which follow the undulating line defined by the outer pillars in a less rigid sense. The opposing sides of the SSL conductive strips 24A, 24B is this layout follow the undulating lines 36A and 36B. For reference, the first undulating line 35A includes crests (e.g. at pillar 35Ac) relative to a line perpendicular to the bit line conductors, the crests being the rightmost apexes of the line in this illustration, and troughs (e.g. at pillar 35At) which are the leftmost nadirs of the first undulating line 35A in this illustration. Likewise, the second undulating line 35B includes crests (e.g. at pillar 35Bc) which are the rightmost apexes of the second undulating line 35B in this illustration, and troughs (e.g. at pillar 35At) which are the leftmost nadirs of the line in this illustration. In the layout illustrated, the trough pillars 35At and 35Bt on the adjacent sides of two conductive strips are aligned in the bit line direction, and would be superposed by the same bit line; and the crest pillars 35Ac and 35Bc on the adjacent sides of two conductive strips are aligned in the bit line direction, and would be superposed by the same bit line. In other embodiments, the troughs and crests are not aligned in this manner.

A side of a conductive strip (including SSL conductive strips 24A, 24B) is said to follow an undulating line of pillars for the purposes of the present description if the side is curved, or with or without discontinuities at crests and troughs as in a sawtooth shape as shown, and the distance in the bit line direction between each pillar in the undulating line and the side of the conductive strip has a minimum that is at least sufficient to meet manufacturing and performance tolerances for reliably surrounding the pillars on the undulating line, and falls within a range above the minimum having an extent less than the distance in the bit line direction between the trough and the crest. A line or shape is "undulating" if the line or a side of the shape is not entirely straight. In one example, an undulating line or side of a shape is curved. In another example, an undulating line or side of a shape is a concatenation of multiple straight line segments, such that although individual line segments are straight, the concatenation is not straight.

Such undulating shapes are formed by one or more curves, and/or concatenated line segments where the angle formed by any two line segments of the respective side is other than 180 degrees.

In the embodiment illustrated in FIG. 4A, outer pillars in a block are more proximate along a given bit line in the bit line direction than other pillars on the given bit line to the sides of the string select lines. In the example where an undulating shape follows an undulating line by remaining equidistant, minor process variation of up to several nanometers is expected.

The SSL conductive strips 24A, 24B have sides such as sides 33A, 33B with an undulating shape following the undulating lines 35A, 35B of the pillars The undulating lines 35A, 35B of the pillars intersect the bit line direction 34 at non-perpendicular angles. Example bit line conductors oriented along the bit line direction 34 are shown in FIGS. 6-11.

Referring to FIG. 4B, insulating dielectric 32 separates each conductive strip from the others, for example each of the word line layers 20-23 from the others.

Sides of conductive strips in the stack of conductive strips in addition to the SSL conductive strips 24A, 24B, can have undulating shapes. Examples of parts of the 3D memory device with sides which can have undulating shapes are the word lines WLs, the string select line SSL, the ground select line GSL, and the ground line common source line or GL.

Vertical channel structures of the pillars 15 comprise semiconductor materials adapted to act as channels for the memory elements, with materials such as Si, Ge, SiGE, GaAs, SiC, and/or Graphene. Memory elements in the memory device include charge storage structures, such as multilayer dielectric charge trapping structures known from flash memory technologies such as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and/or MA BE-SONOS (metal-high-k bandgap-engineered silicon-oxide-nitride-oxide-silicon).

A word line stack such as the illustrated stack including word line conductive strips 20-23 intersects a block of the pillars in the overall structure, and thus can be said to define a block of memory cells. Thus to read a page of data from a particular block of the memory, control circuitry activates a word line such as word line conductive strip 20 to select a block of cells and a particular layer of the block, and further activates a particular string select line 24 to select a particular page of pillars. A ground select gate in ground select line 25 is activated as well that selects at least the block selected by the word line. A page of cells is then read out in parallel via bit line conductors coupled to the tops of the selected page of pillars 15, into a page buffer (not shown). ("Activate", as used herein, means to apply a particular bias so as to give effect to the connected cells or switches. The bias may be high or low, depending on the memory design and the operation being performed.) Depending on the product specification and design, the page buffer may be coupled to many blocks of memory cells via different sets of bit line, and thus hold more than a page from a single block.

Figure 5A:
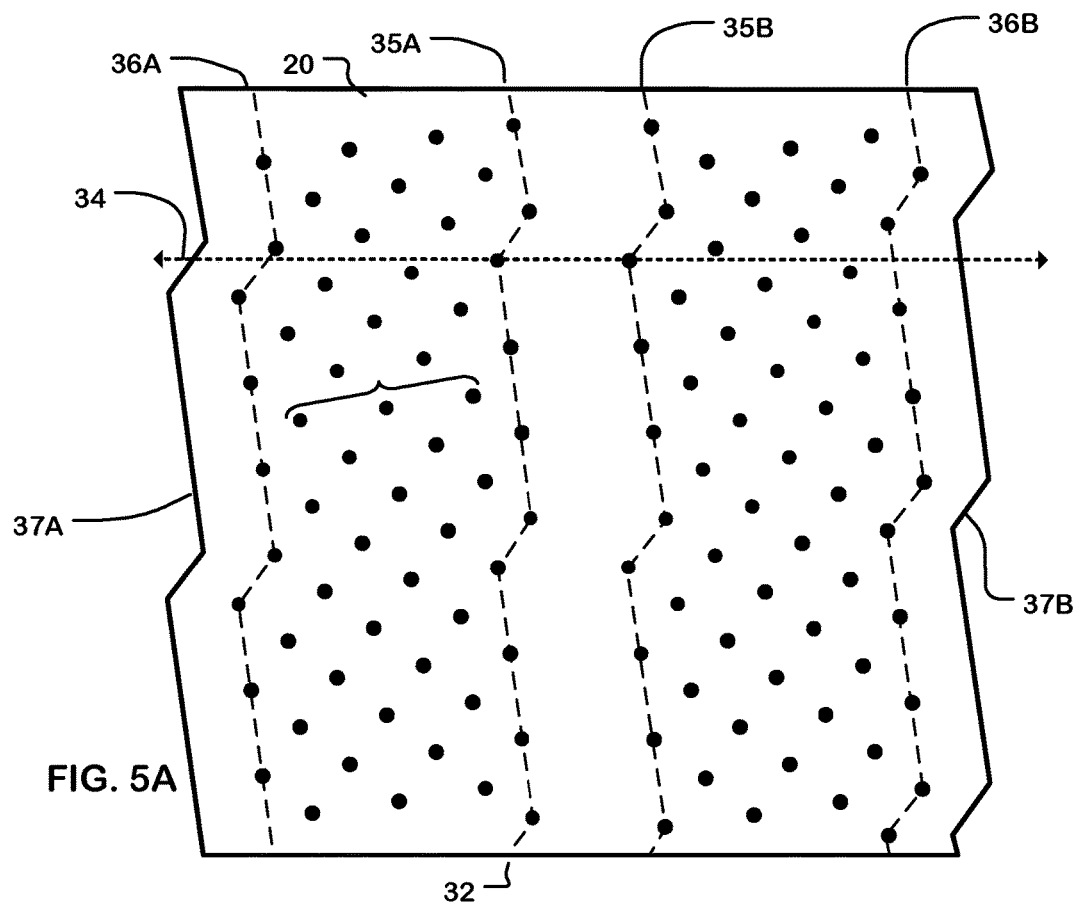
FIGS. 5A and 5B respectively illustrate a top view and a side view of an implementation of a 3D memory device using a vertical channel structure, where the top view shows word lines.
Figure 5B:
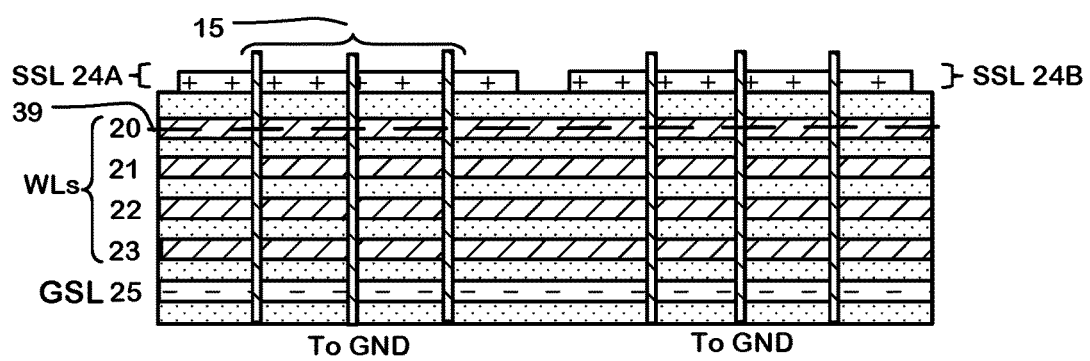

FIGS. 5A and 5B respectively illustrate a top view and a side view of an implementation of a 3D memory device using a vertical channel structure, where the top view shows a word line conductive strip 20 having sides with undulating shapes. FIGS. 5A and 5B generally show the same structure as FIGS. 4A and 4B. However, whereas the top view of FIG. 4A shows the string select line conductive strips 24A, 24B separated by dielectric 32, the top view of FIG. 5A shows a word line conductive strip 20. The top view of FIG. 5A is a top view of the cross-section through line 39 in the side view of FIG. 5B.

Sides of the word line conductive strips, such as sides 37A, 37B, have undulating shapes that follow the undulating lines 35A, 35B of the pillars. Also, the opposing sides of the word line conductive strips follow undulating lines 36A, 36B.

Figure 6:
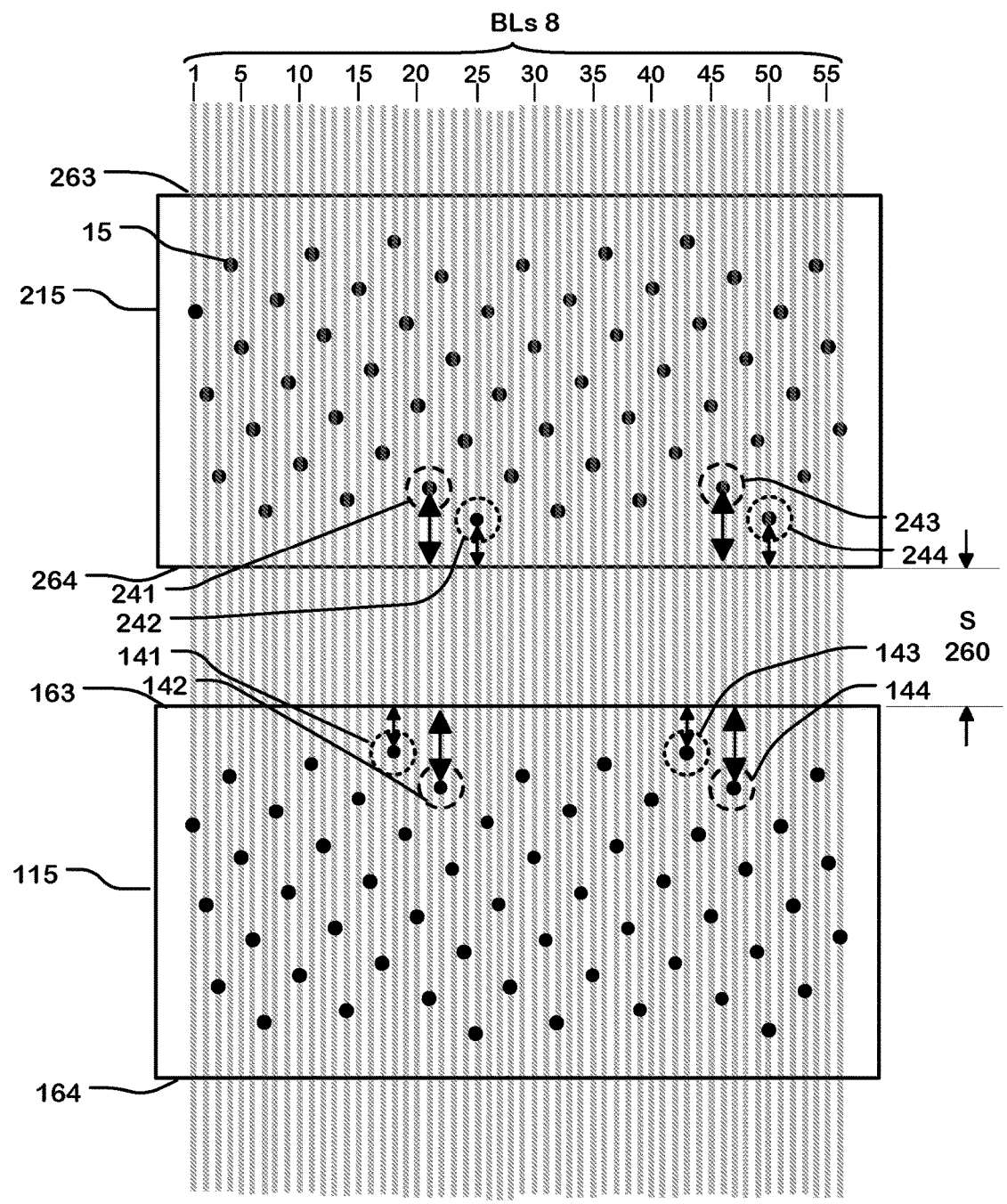
FIG. 6 is a top view showing a parallel set of bit line conductors that are in electrical contact with the tops of pillars.

FIG. 6 is a top view (rotated by 90 degrees relative to FIGS. 4A and 5A) showing a parallel set of bit line conductors 8 that are in electrical contact with the tops of pillars, where the pillars intersect string select lines 115 and 215 with straight sides 163, 164, 263, and 264. In a string select line level below the bit line level with bit line conductors 8, SSL lines 115 and 215 intersect the pillars. Each pillar 15 has a corresponding pair of distances, between the pillar and the top side of the respective SSL line, and between the pillar and the bottom side of the respective SSL line. The top side 163 of SSL line 115 is separated from the bottom side 264 of SSL line 215 by a distance S 260.

In the illustrated example, the following 4 shorter distances, characterizing a narrow process window, are equal, within a minor process variation of several nanometers: (i) distance between pillar 141 and the top side of SSL line 115, (ii) the distance between pillar 143 and the top side of SSL line 115, (iii) the distance between pillar 242 and the bottom side of SSL line 215, and (iv) the distance between pillar 244 and the bottom side of SSL line 215. Such pillars are shown with circles of short dashed lines.

In the illustrated example, the following 4 longer distances, characterizing a wide process window, are equal, within a minor process variation of several nanometers: (i) distance between pillar 142 and the top side of SSL line 115, (ii) the distance between pillar 144 and the top side of SSL line 115, (iii) the distance between pillar 241 and the bottom side of SSL line 215, and (iv) the distance between pillar 243 and the bottom side of SSL line 215. Such pillars are shown with circles of long dashed lines.

The inequality of the longer distances to the shorter distances means that the process windows are unequal. However, such unequal process windows follow from the rotated grid of pillars positioned in SSL line 115 and SSL line 215 having straight sides, including top sides and bottom sides. SSL line 115 and SSL line 215 are separated by distance S 260. If an axis of the rotated grid is not parallel to an SSL line side, then unequal process windows result.

Figure 7:
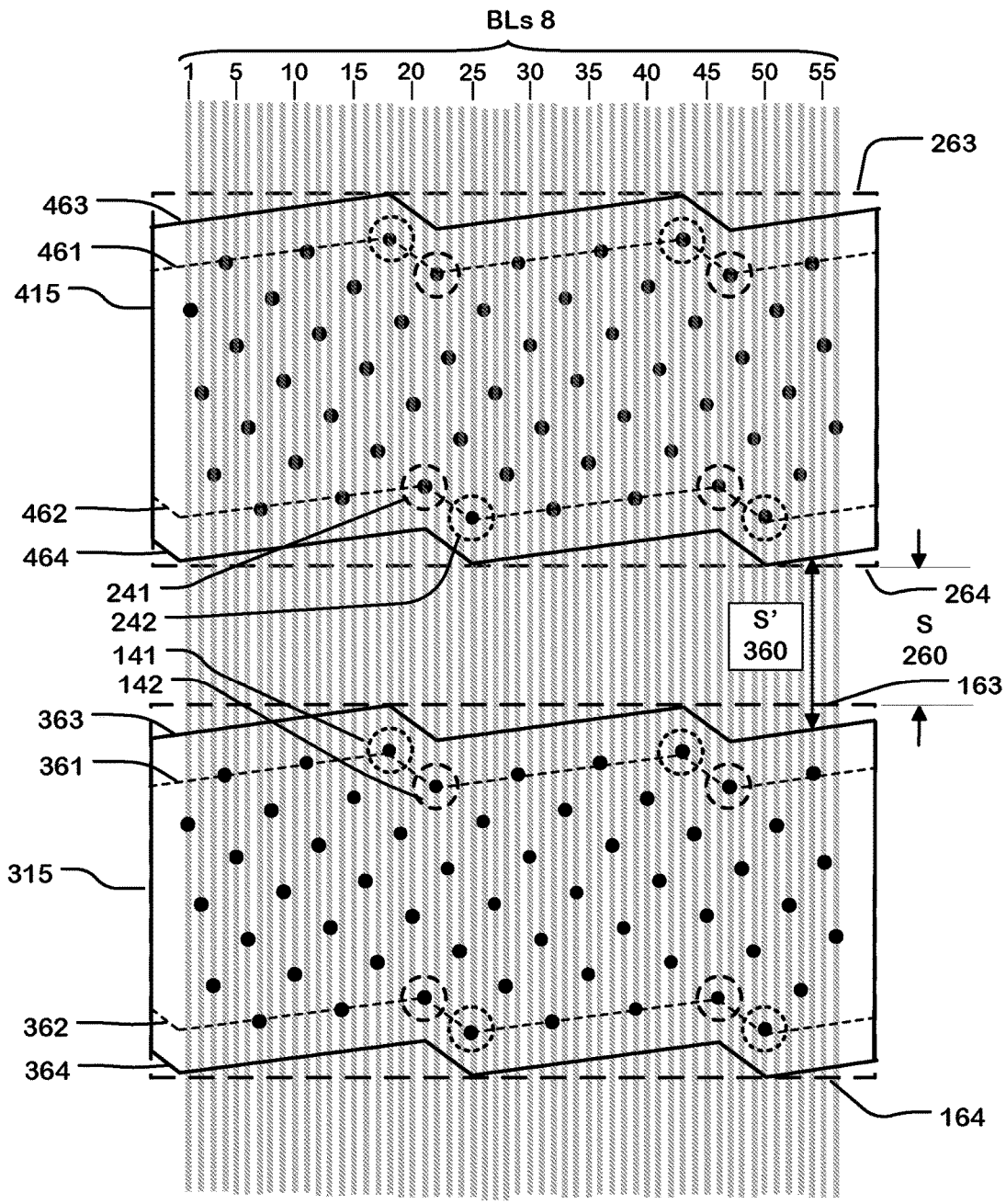
FIG. 7 is a top view showing a parallel set of bit line conductors that are in electrical contact with the tops of pillars, where the pillars intersect string select lines with sides having undulating shapes.

FIG. 7 is similar to FIG. 6, and common reference numerals are utilized for common elements. However, SSL line 315 and SSL line 415 in FIG. 7 have sides 363, 364, 463, and 464 with undulating shapes, in contrast with straight sides 163, 164, 263, and 264 of SSL line 115 and SSL line 215 in FIG. 6.

The sides of SSL line 315 and SSL line 415 are parallel to the undulating lines 361, 362, on the regular grid which defines positions of the outer pillars 15 within the respective SSL line. The outer pillars 15 within the respective SSL line are closest to the sides of the respective SSL line in contrast with other pillars 15. Undulating lines 361, 362, 461, and 462 of the pillars 15 are defined by the joined grid portion lines. The sides of SSL line 315 and SSL line 415 with undulating shapes follow the grid portion lines 361, 362, 461, and 462. The grid portion lines 361, 362, 461, and 462 intersect the bit line direction of the bit line conductors 8 at non-perpendicular angles. For example, the top side of SSL line 315 is parallel to a set of grid lines 361 connecting the positions of the pillars 15 SSL line 315. In another example, the bottom side of SSL line 415 is parallel to a set of grid lines 462 connecting the positions of the bottom pillars 15 in SSL line 415. In the example where one line follows another line by remaining equidistant, minor process variation of up to several nanometers is expected.

SSL lines 315 and 415 are generally narrower, as shown by the sides 363, 364, 463, and 464 with undulating shapes in FIG. 7 that are generally narrower in comparison with the straight sides 163, 164, 263, and 264 of SSL lines 115 and 215 in FIG. 6, shown as straight dashed lines in FIG. 7. Whereas SSL lines 115 and 215 were separated by distance S 260, SSL lines 315 and 415 are separated by distance S' 360, which can be different than the distance S. In this example, the distance S' is greater than the distance S. The wider distance S' 360 results from removing extra SSL line material which resulted in some outer pillars 15 having a wide process window. After removing the extra SSL line material, the outer pillars, more proximate than other pillars to the SSL line sides, generally have a same, more narrow process window.

In the illustrated example, a trough pillar on undulating line 461 and a trough pillar on undulating line 361 are superposed by and connected to the same bit line (e.g., number 22 out of the 56 illustrated). Also, a crest pillar on undulating line 361 and a crest pillar on line 461 are superposed by and connected to the same bit line (e.g., bit line 18 out of the 56 illustrated). This is a different configuration of the grids of pillars than described with reference to FIG. 4A.

Figure 8:
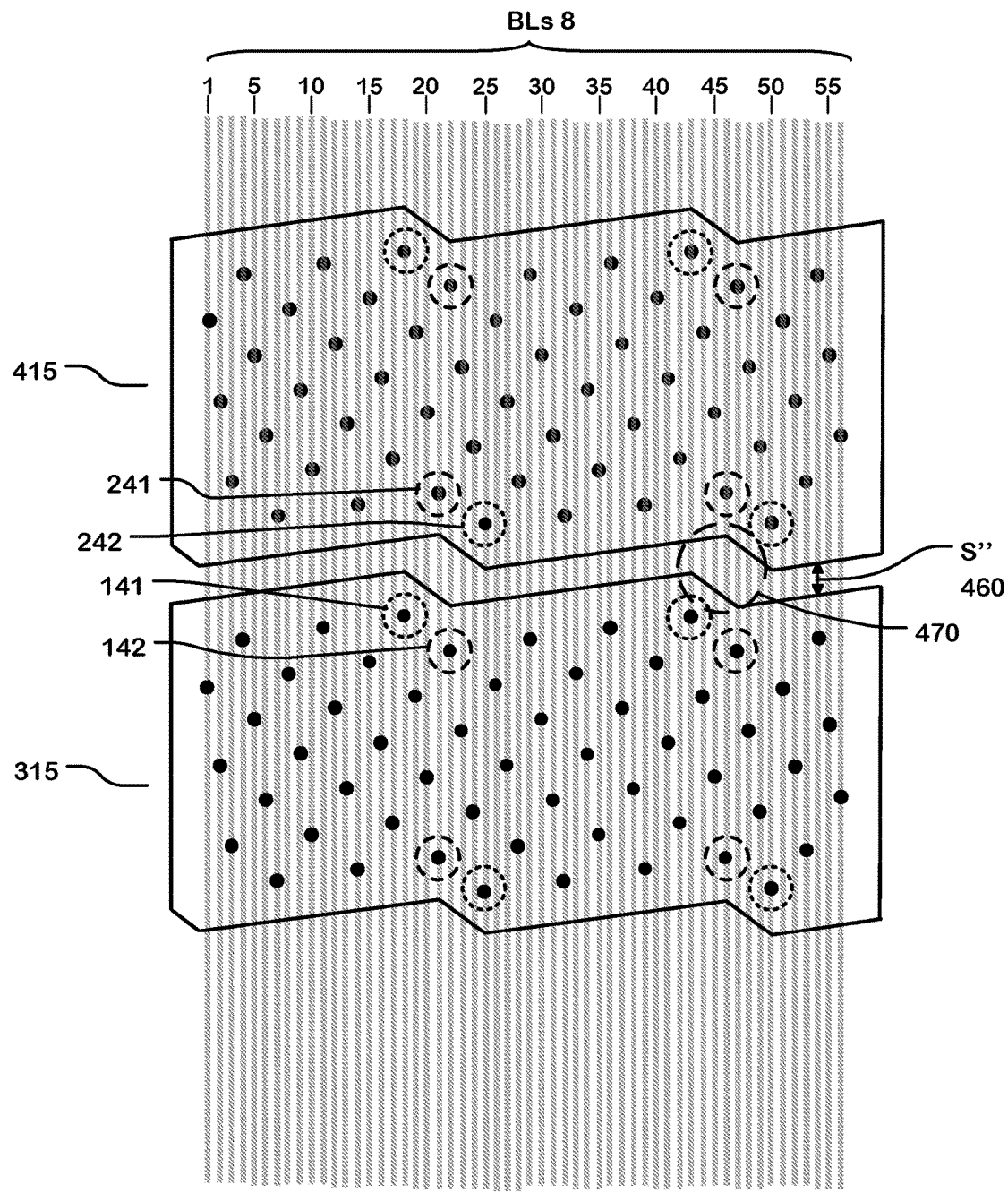
FIG. 8 is a top view showing a parallel set of bit line conductors that are in electrical contact with the tops of pillars, where the pillars intersect string select lines with sides having undulating shapes, and the SSL lines are shifted more closely together.

FIG. 8 is a top view, like that of FIG. 7, showing a parallel set of bit line conductors 8 that are in electrical contact with the tops of pillars, where the pillars intersect string select lines with sides having undulating shapes, and the SSL lines 315 and 415 and grids of pillars are shifted more closely together in the bit line direction. As a result, the pitch of the grid of SSL line 315 is offset from the pitch of the grid of SSL line 415 in the bit line direction.

In FIG. 8, after shifting together SSL lines 315 and 415, a narrower distance S" 460 separates SSL lines 315 and 415, in comparison with distance S' 360 in FIG. 7. The direction of shift corresponds to moving the SSL lines closer together along a direction along the bit line direction parallel to the BLs 8. Because the shift direction is purely vertical, the pillar distributions of SSL lines 315 and 415 to bit line conductors are the same when compared before and after the vertical shift. Each pillar distribution is characterized by a same number (one) of pillars with each SSL line along each bit line, and same relative position of pillars along the bit line conductors relative to the sides of the SSL lines 315 and 415. In the illustrated example, as in FIG. 7, a trough pillar on undulating line 461 and a trough pillar on undulating line 361 are superposed by and connected to the same bit line (e.g., number 22 out of the 56 illustrated). Also, a crest pillar on undulating line 361 and a crest pillar on line 461 are superposed by and connected to the same bit line (e.g., bit line 18 out of the 56 illustrated).

However, region 470 in the vicinity of the crest and trough pillars still shows uneven layouts and process windows. In region 470, SSL lines 315 and 415 are separated by distances larger than S" 460.

Figure 9:
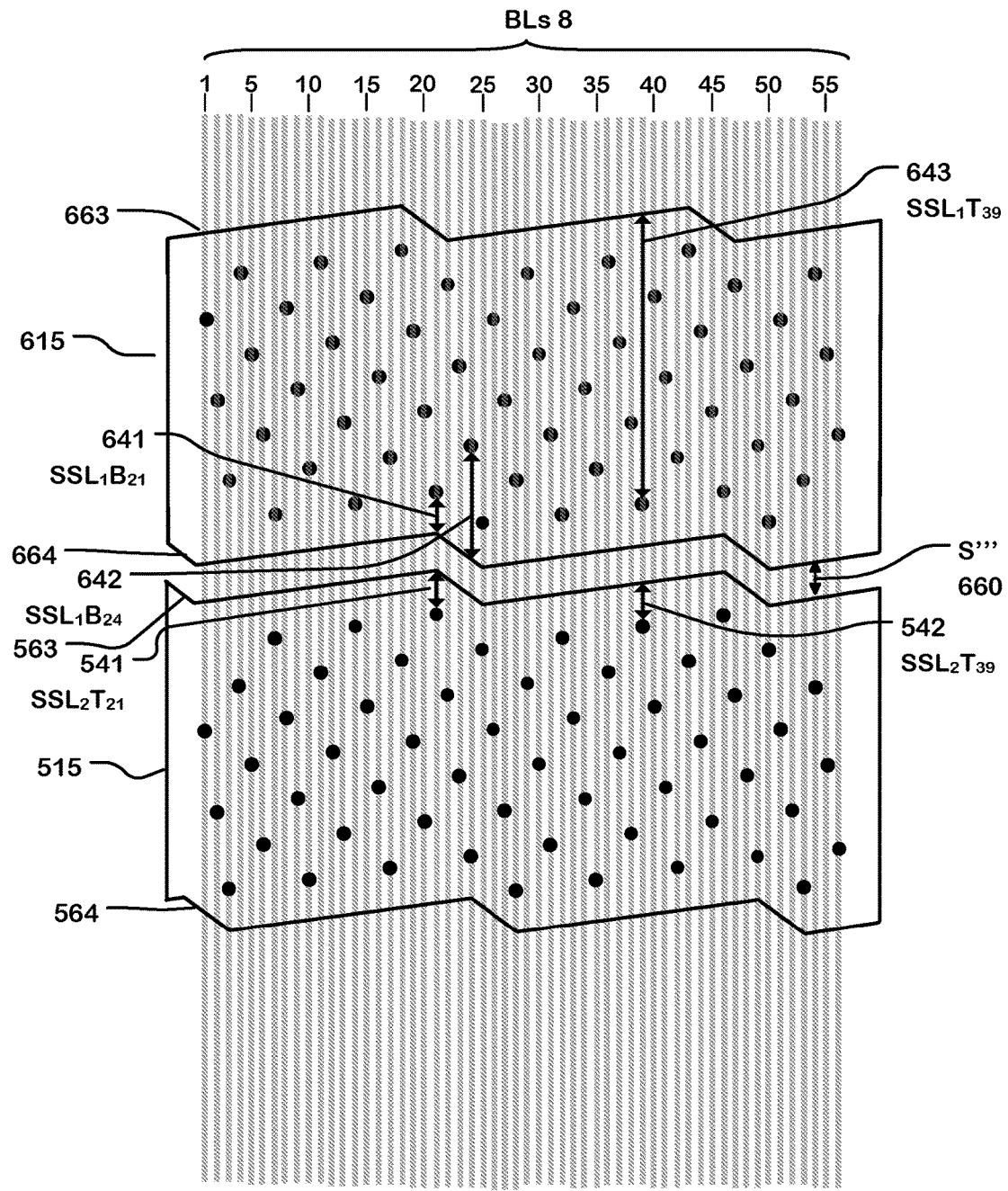
FIG. 9 is a top view showing a parallel set of bit line conductors that are in electrical contact with the tops of pillars, where the pillars intersect string select lines with sides having undulating shapes, and the SSL lines are shifted even more closely together.

FIG. 9 is a top view, like FIG. 8, showing a parallel set of bit line conductors 8 that are in electrical contact with the tops of pillars, where the pillars intersect string select lines with sides having undulating shapes, and the SSL lines and grids of pillars are shifted both vertically (in the bit line direction) and horizontally (perpendicular to the bit line direction), and as a result can be placed even more closely together. The horizontal direction of shift corresponds to moving the SSL lines closer together along a direction perpendicular to the bit line direction parallel to the BLs 8. Example sizes of horizontal shifts include shifts of an entire SSL line with a shift magnitude of 1, 2, or 3 bit line conductors in either the direction of increasing bit line numbering or decreasing bit line numbering. Expressed differently, different pillar distributions in different SSL lines can be matched, if the pillar distribution of one SSL line is shifted 1, 2, or 3 bit line conductors in either the direction of increasing bit line numbering or decreasing bit line numbering.

In the layout illustrated in FIG. 9, the trough pillars on the adjacent sides 563, 664 of two conductive strips are aligned in the bit line direction, and would be superposed by the same bit line (e.g., bit line 25 of the 56 bit line conductors); and the crest pillars 35Ac and 35Bc on the adjacent sides 563 of two conductive strips, 664 are aligned in the bit line direction, and would be superposed by the same bit line (e.g., bit line 21 of the 56 bit line conductors). In other embodiments, the troughs and crests are not aligned in this manner.

As a result, regions of uneven separations of the SSL conductive strips and process windows are generally reduced or eliminated. Because the shift direction is horizontal, the collective pillar distribution of SSL lines 315 and 415 before the horizontal shift are different from the collective pillar distribution of SSL lines 515 and 615 after the horizontal shift. Also, across different pillar distributions of different SSL lines, along each bit line the pillars in different SSL lines 515 and 615 can have different relative position relative to the sides 563, 564, 663, and 664 of the SSL lines 515 and 615. In different embodiments, the distance S''' 660 separating SSL lines 515 and 615 after the horizontal shift is equal to, less than, or greater than the distance S'' 460 that separates SSL lines 315 and 415 before the horizontal shift.

$SSL_xT_y$ specifies the distance between a pillar coupled to bit line "y" and the top side of SSL line x, and $SSL_xB_y$ specifies the distance between a pillar coupled to bit line "y" and the bottom side of SSL line x. For example, $SSL_1B_{24}$ 642 specifies the distance between a pillar coupled to bit line 24 and the bottom side of SSL line 1. Multiple examples of the different pillar distributions in different SSL lines are specified:

(i) $SSL_aT_n \neq SSL_{a+1}T_n$. For example, $SSL_1T_{39}$ 643≠$SSL_2T_{39}$ 542.

(ii) $SSL_aB_m = SSL_{a+1}T_m$. For example, $SSL_1B_{21}$ 641=$SSL_2T_{21}$ 541.

A method of manufacturing a memory device is described that includes forming an array of vertical NAND strings disposed below a set of bit line conductors, the bit line conductors extending in a bit line direction, and forming string select lines and word lines of the vertical NAND strings comprising conductive strips configured in layers. The method includes configuring the vertical NAND strings in the array extending through the layers of conductive strips, into pages of NAND strings, NAND strings in a given page being coupled with the conductive strip of a corresponding single string select line for the given page, the NAND strings in each page being disposed in a grid that is tilted by an off-angle relative to the bit line direction. The method includes forming curved sides on the conductive strips of the string select lines in a way that allows closer packing of the pages. Also, the method can include forming curved sides on the conductive strips of the plurality of word lines. Also, the vertical NAND strings in the array have ground select switches comprising conductive strips in the layers of conductive strips, and the method can include forming curved sides on the conductive strips of the ground select lines.

As described with reference to FIGS. 8 and 9, the method includes disposing the NAND strings in each page in a regular grid that is tilted relative to the bit line direction, the regular grid having a regular pitch in a direction tilted from the bit line direction, and offsetting the regular grids of first and second adjacent pages from the regular pitch. The offsets can be made in one or both of the bit line direction (e.g. FIG. 8) and a direction perpendicular to the bit line direction (e.g. FIG. 9).

Figure 10:
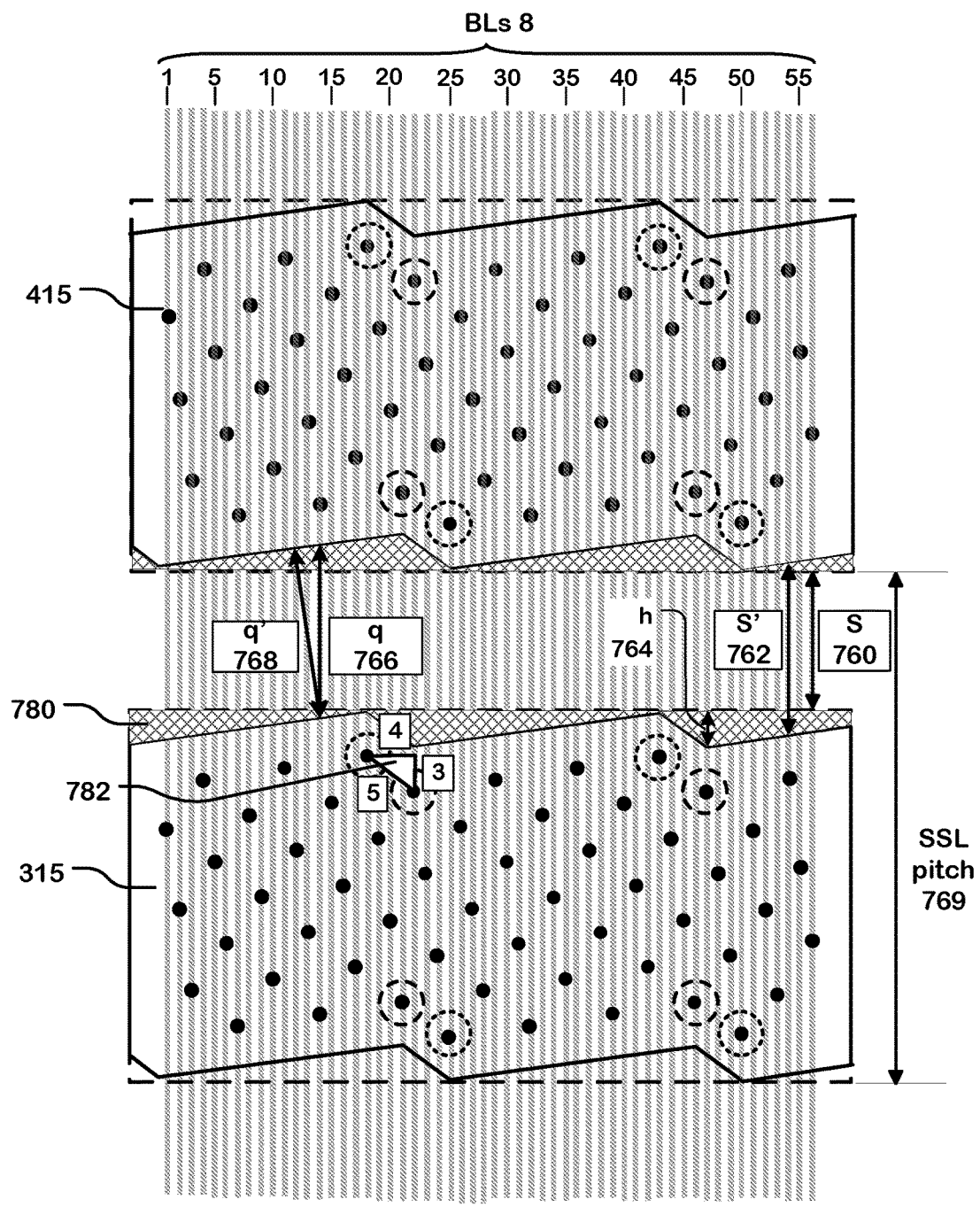
FIG. 10 is similar to FIG. 7, and shows the area saved from the undulating shapes of the string select lines.

FIG. 10 is similar to FIG. 7, and shows the area saved from the curved or undulating sides of the string select lines.

For example, cross-hatched region 780 represents a saved area absent from SSL lines 315 and 415 with sides having undulating shapes that were originally in SSL lines 115 and 215 with straight sides. The saved area is the amount saved out of SSL pitch 769, which is the difference h 764 between (i) distance S 760 separating SSL line 115 and SSL line 215 with straight sides, and (ii) distance S' 762 separating SSL line 315 and SSL line 415 with sides having undulating shapes.

The distance h 764 is approximately a distance along the bit line direction which corresponds to the "3" side of 3-4-5 right triangle 782. The "5" side of 3-4-5 right triangle 782 is equal to "a" the memory cell diameter in this example. According to relative lengths of the 3-4-5 right triangle 782, h 764=(3/5)*a. So, the saved area corresponds to the saved distance along the SSL pitch 769 or h=(3/5)*a, due to changing the SSL lines from straight sides to sides having undulating shapes. The approximation results from the slight difference in direction between q 766 and q' 768. The direction q 766 is the distance between SSL lines 315 and 415 which is parallel to bit line conductors BLs 8. The direction q' 768 is the direction between SSL lines which is perpendicular to the outer sides of SSL lines 315 and 415 having undulating shapes.

Figure 11:
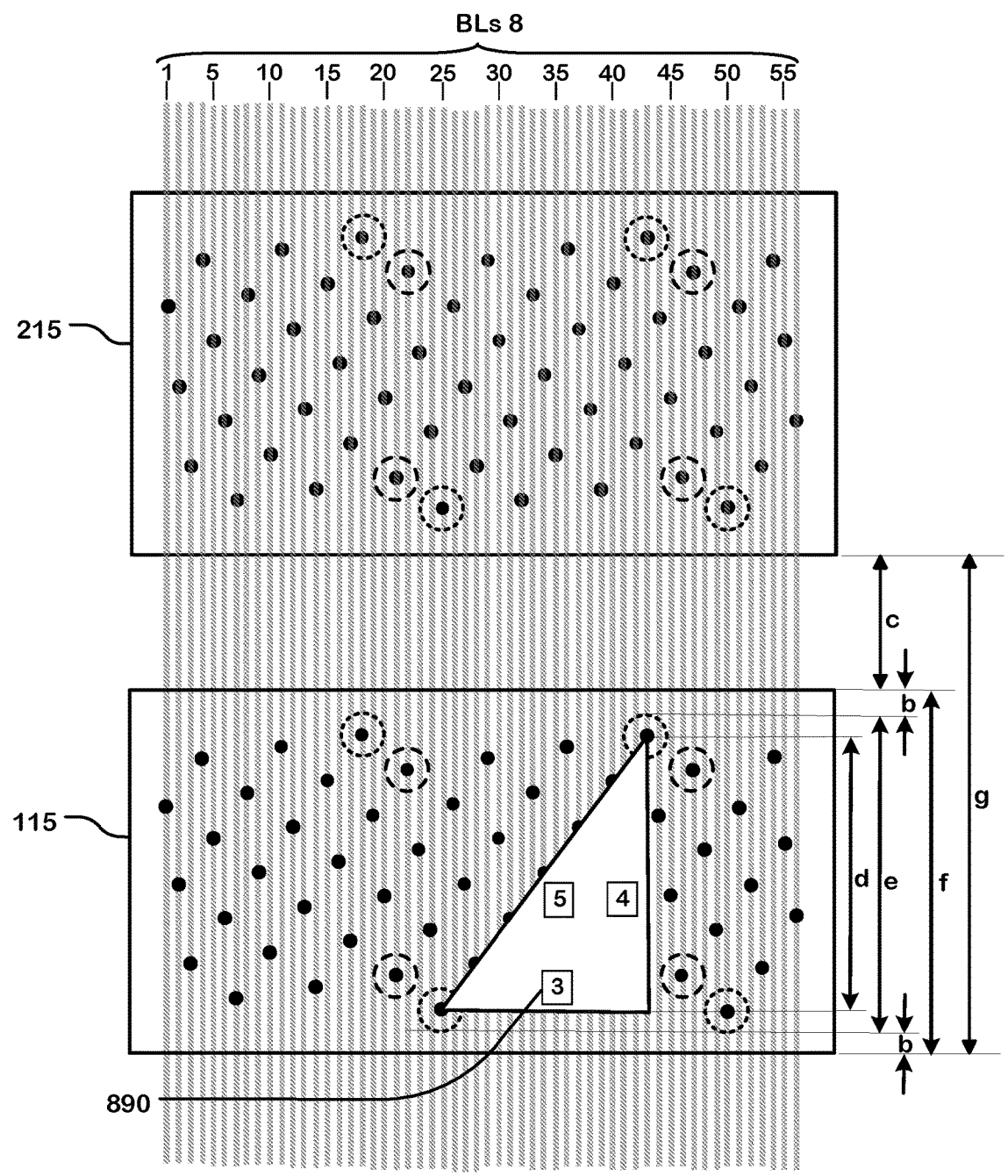
FIG. 11 is similar to FIG. 6, and shows an example of the area saved from the undulating shapes of the string select lines.

FIG. 11 is similar to FIG. 6, and shows an example of the area saved from the sides of the string select lines having curved or undulating shapes. The table shows relevant dimensions with example sizes to calculate saved area.

| Pillar diameter | A | 160 nm |
|---|---|---|
| Space from outer pillar to SSL side | B | 25 nm |
| Space separating SSL lines | C | 180 nm |
| SSL pitch | G | 1158 nm |
| Saved pitch distance | H | 96 nm |
| Saved area | h/g | 8.3% |

Figure 2:
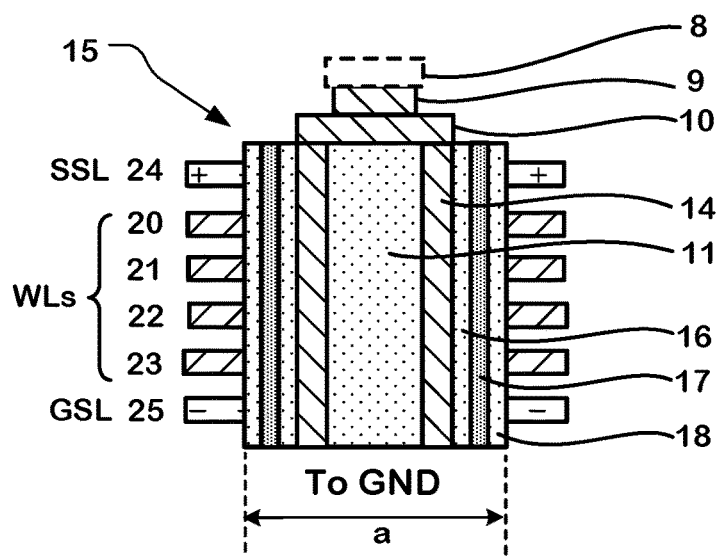
Figure 3:
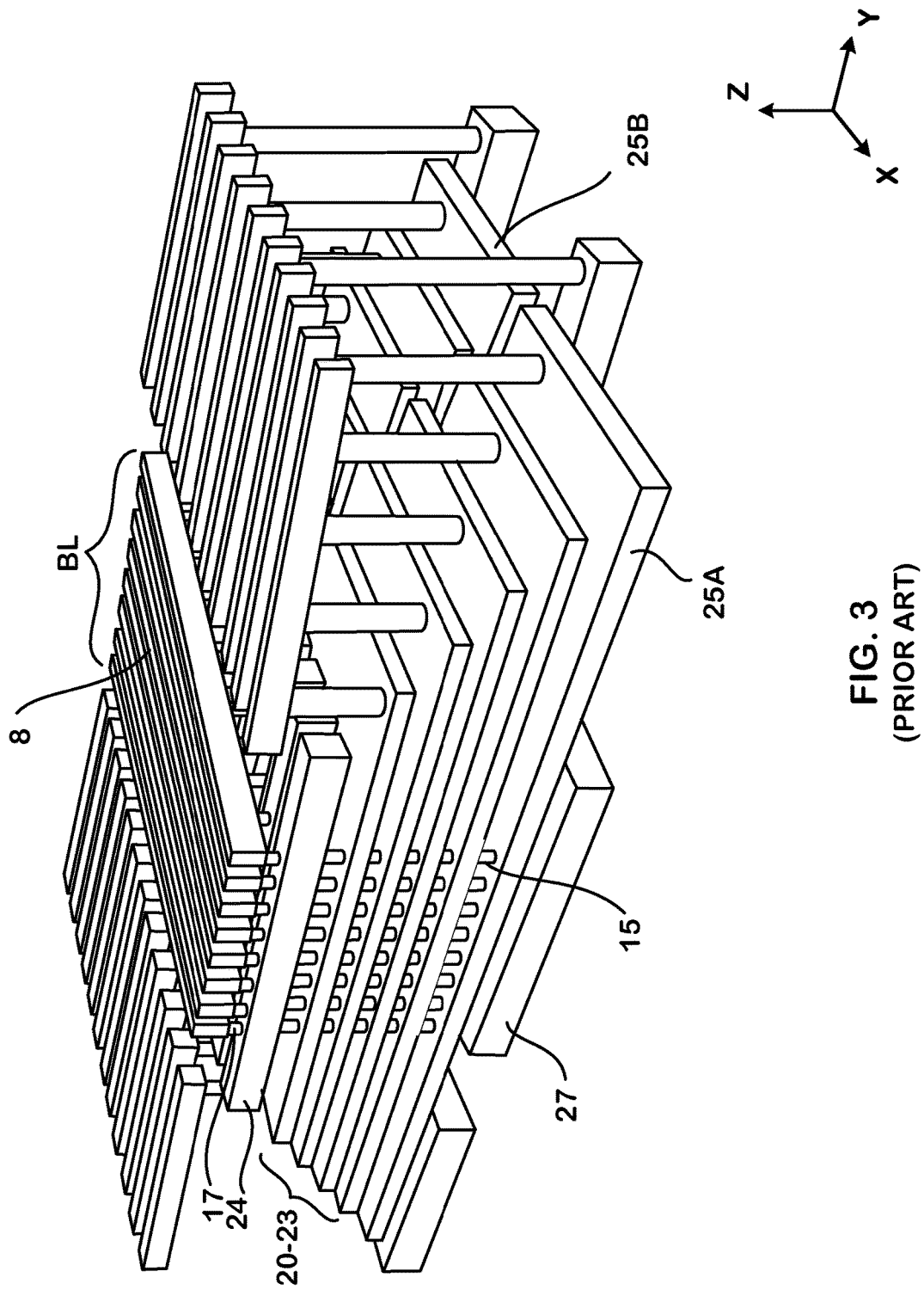
FIG. 3 is a perspective view of a 3D semiconductor device.

Pillar diameter "a" is shown from FIGS. 1 and 2.

Space from outer pillar to SSL side, "b" is shown in FIG. 11 by both sides of SSL line 115.

Space separating SSL lines, "c" is shown in FIG. 11 as separating SSL lines 115 and 215.

The distance "d" is approximately the distance along the bit line direction which corresponds to the "4" side of 3-4-5 right triangle 890. The "5" side of 3-4-5 right triangle 890 is equal to 6 units of "a" the memory cell diameter, or 6a. According to relative lengths of the 3-4-5 right triangle 890, "d"=(4/5)*6a.

The distance "e" is the sum of distance "d" and an additional unit of "a" the memory cell diameter, or half of an "a" on both sides of the distance "d". e=d+a.

The distance "f" is the sum of distance "e" and both spaces from outer cell to SSL side "b". f=e+2b.

The distance "g" is the sum of distances "c" and "f".

Accordingly, in one example the undulating shapes save 8.3% in area. Other embodiments have a different quantity in one or more of a, b, c, d, e, f, g, and h.

FIGS. 12A and 12B respectively illustrate a top view and a side view of an implementation of a 3D memory device using a vertical channel structure. FIG. 12A is a top view of the cross-section through line 40 through the conductive strips of GSL 26A and GSL 26B in a lower layer of conductive strips, of the side view of FIG. 12B. FIGS. 12A and 12B generally show the same structure as FIGS. 4A and 4B. However, the ground select line GSL 25 is divided into a larger number of ground select lines GSL 26A, 26B which are separately turned on. As shown in FIG. 12A, sides of each of the ground select lines GSL 26A, 26B have undulating shapes.

As seen in FIG. 12A, sides of the conductive strips of ground select lines, such as sides 38A, 38B of ground select lines 26A, 26B, have undulating shapes that follow the undulating lines 35 of the pillars.

Figure 13A:
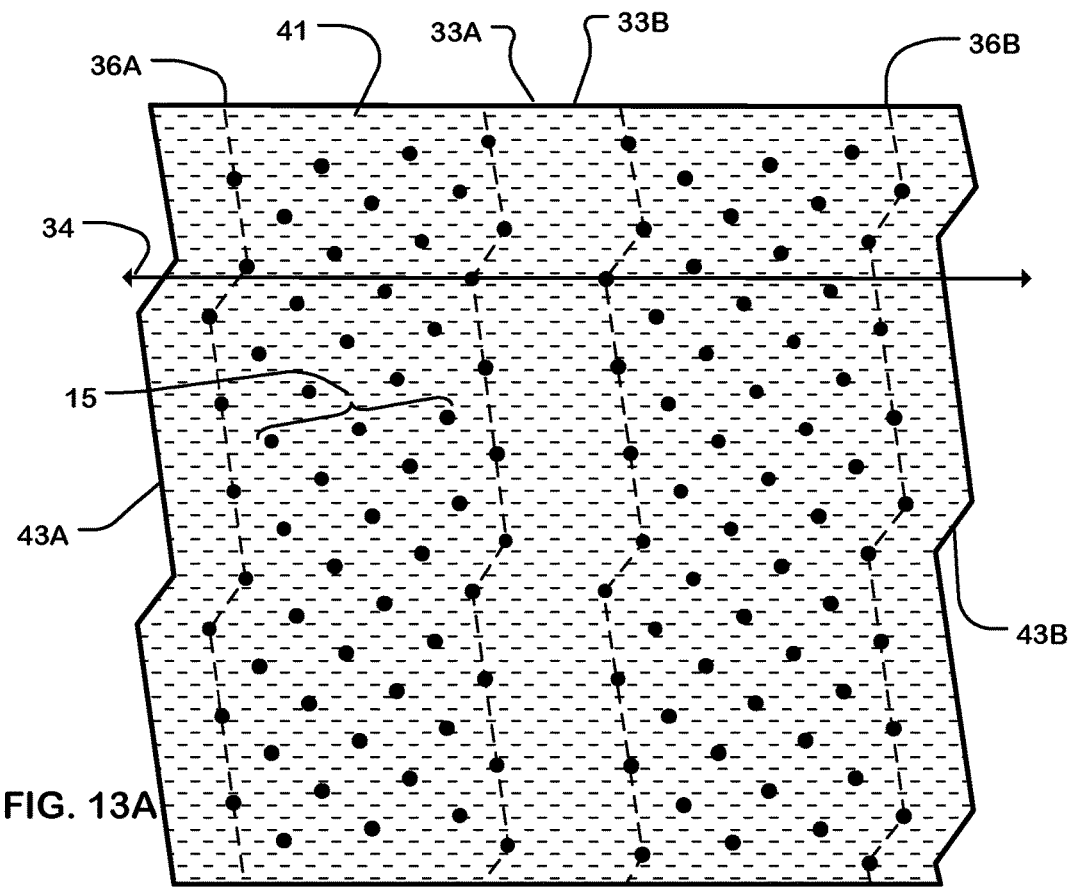
FIGS. 13A and 13B respectively illustrate a top view and a side view of an implementation of a 3D memory device using a vertical channel structure, where the top view shows ground lines.
Figure 13B:
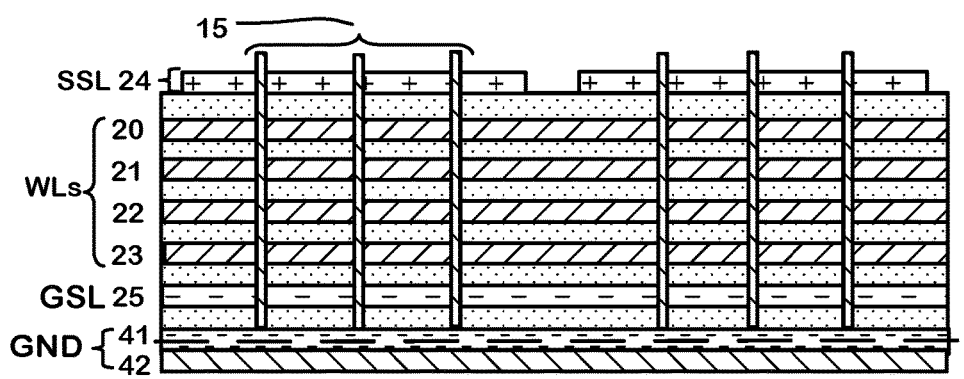

FIGS. 13A and 13B respectively illustrate a top view and a side view of an implementation of a 3D memory device using a vertical channel structure. FIG. 13A is a top view of the cross-section through layer 41 of the side view of FIG. 13B. FIGS. 13A and 13B generally show the same structure as FIGS. 4A and 4B. However, a multi-layer ground line GL (or common source line) 41/42 is shown below the ground select line GSL 25. The ground line upper layer 41 is heavily doped polysilicon, with a doping level such as over $10^{20}$ cm$^{-3}$, n-type or p-type. The ground line lower layer 42 is a metal such as W. As shown in FIG. 13A, sides of each of the ground lines GL 41/42 have shapes that are undulating.

Sides of the ground lines, such as sides 43A, 43B of ground line 41/42, have undulating shapes that follow the outer undulating lines 36A, 36B of the pillars.

Figure 14:
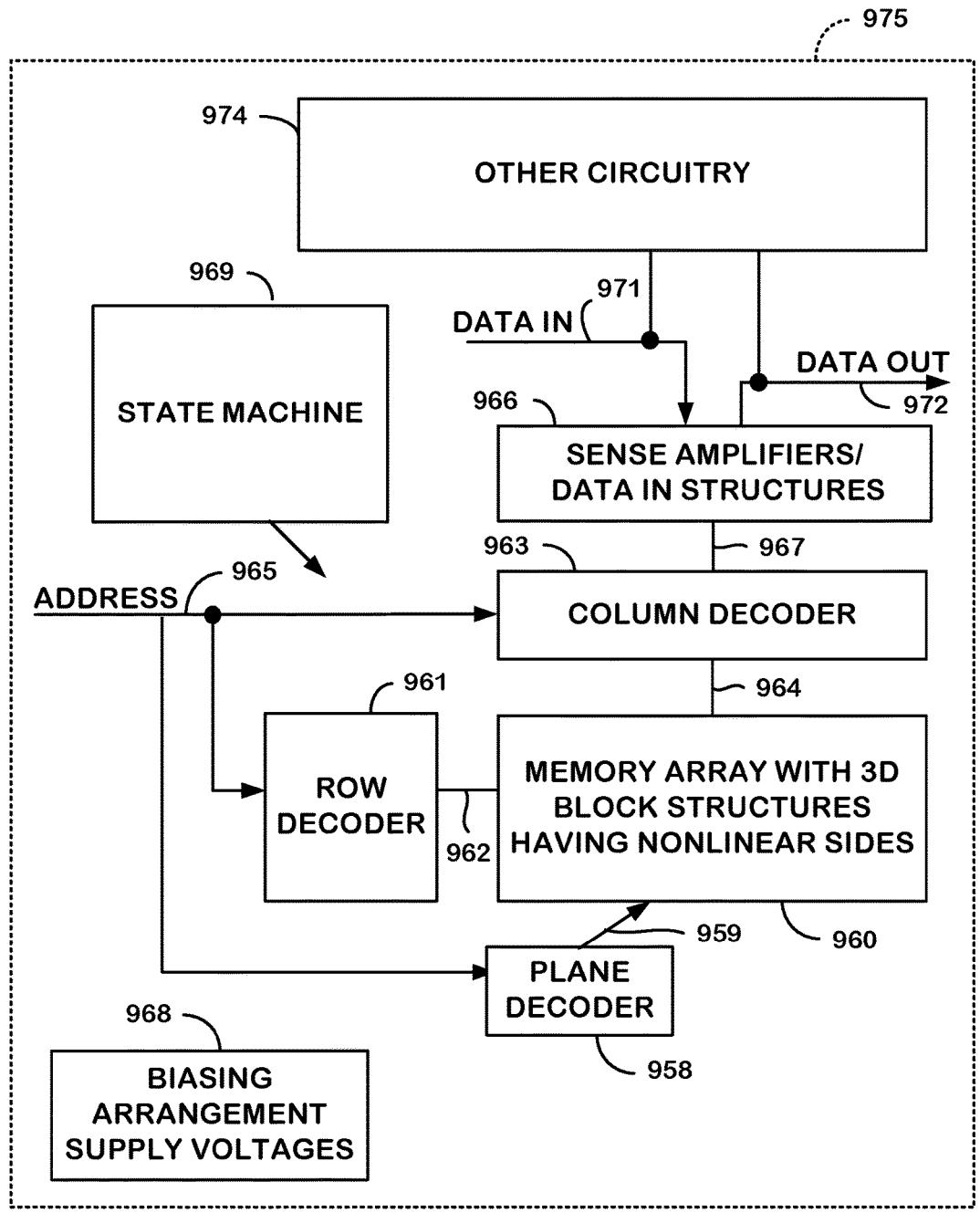
FIG. 14 is a simplified block diagram of an integrated circuit memory having a 3D vertical gate memory array with undulating shapes as shown herein.

FIG. 14 is a simplified block diagram of an integrated circuit memory having a 3D vertical gate memory array with undulating side structure as shown herein.

The integrated circuit 975 includes a memory array 960, implemented as described herein with 3D block structures having non-linear or undulating sides, on a semiconductor substrate. For example, any of the string select lines, word lines, ground select lines, and ground lines have sides with undulating shapes. A row decoder 961 is coupled to a plurality of word lines 962, and arranged along rows in the memory array 960. A column decoder 963 is coupled to a plurality of bit line conductors 964 (or SSL lines as described above) arranged along columns in the memory array 960 for reading and programming data from the memory cells in the array 960. A plane decoder 958 is coupled to a plurality of planes in the memory array 960 via SSL lines 959 (or bit line conductors as described above). Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The bias arrangement state machine 969 is configured to perform memory operations including erase, program, and read, such as a read operation by applying a read bias to a selected one of the plurality of word lines, and selecting a page using a signal on an SSL line.

The memory array 960 can comprise charge trapping memory cells configured to store multiple bits per cell, by the establishment of multiple program levels that correspond to amounts of charge stored, which in turn establish memory cell threshold voltages VT.

Layout overhead is reduced between adjacent blocks of a 3D vertical channel memory device. Vertical pillars, which intersect horizontal layers of string select lines and word lines, are arranged at intersections of a regular grid that is rotated, in a "twisted" array of pillars. The outer pillars of the array of pillars are disposed in undulating lines. Sides of the 3D NAND array structure have undulating shapes that follow the undulating lines of the array of pillars. For example, sides of the string select lines, word lines, ground select lines, and ground lines have undulating shapes following the undulating lines of the array of pillars. The undulating lines of the array of pillars and undulating shapes of the string select lines, word lines, ground select lines, and ground lines eliminate surplus material by the sides of the 3D NAND array structure, and reduce overhead.

Various aspects of the technology are directed to a memory device on a substrate, comprising a 3D memory device with a vertical channel structure.

The 3D memory device with a vertical channel structure includes a multilevel stack of conductive layers of word lines, a plurality of pillars, a plurality of string select lines positioned above the conductive layers, and a plurality of bit line conductors running along a bit line direction and positioned above the string select line lines.

Each of the pillars comprises a plurality of series-connected memory cells located at cross-points between the pillars and the conductive layers. In some embodiments the pillars in the plurality of pillars are arranged on a regular grid having a plurality of lateral dimensions.

In some embodiments each of the string select lines intersects a respective subset of the pillars, the subset referred to as a page herein. Each of the intersections of a pillar of the plurality of pillars and a string select line of the plurality of string select lines defines a respective select gate of the pillar.

The plurality of pillars includes outer pillars proximate to sides of the plurality of string select lines. Outer pillars of the plurality of pillars are disposed in undulating lines.

In one aspect of the technology, string select lines in the plurality of string select lines each have sides. The sides have undulating shapes that follow the undulating lines of the plurality of pillars.

In one aspect of the technology, the word lines each have sides. The sides have undulating shapes that follow the undulating lines of the plurality of pillars.

In one aspect of the technology, a ground select line is in a lower level of a multilevel stack of conductive layers of word lines. The ground select line has sides. The sides have undulating shapes that follow the undulating lines of the plurality of pillars.

In one aspect of the technology, a ground line is above the substrate and below the multilevel stack of conductive layers of word lines. The vertical ground line has sides. The sides have undulating shapes that follow the undulating lines of the plurality of pillars.

In one embodiment of the technology, out of a subset of bit line conductors in the plurality of bit line conductors that intersects at least one pillar in the plurality of pillars that intersect the first string select line, each bit line conductor of the subset of bit line conductors has a distance between (i) a pillar of the plurality of pillars that intersect said each bit line conductor and the first string select line, the pillar being closest to the second side of the first string select line out of the pillars of the plurality of pillars that intersect said each bit line conductor and the first string select line and (ii) the second side of the first string select line. The first distance is equal to a minimum out of the distances.

In one embodiment of the technology, a first bit line conductor of the plurality of bit line conductors runs from a first bit line end to a second bit line end. The first bit line conductor overlaps a first string select line and a second string select line of the plurality of string select lines. The first string select line and the second string select line each have opposite sides including a first side and a second side such that the first side is closer to the first bit line end than to the second bit line end.

The first bit line conductor intersects a first subset of the plurality of pillars that intersect the first string select line, and the first bit line conductor intersects a second subset of the plurality of pillars that intersect the second string select line. The first subset of the pillars includes a first pillar closest to the first side of the first string select line out of the pillars in the first subset of the pillars. The second subset of the pillars includes a second pillar closest to the first side of the second string select line out of the pillars in the second subset of the pillars.

A first distance is between the first pillar and the first side of the first string select line. A second distance is between the second pillar and the first side of the second string select line. The first distance and the second distance are different.

In one embodiment of the technology, a second bit line conductor of the plurality of bit line conductors runs from a third bit line end to a fourth bit line end. The second bit line conductor overlaps the first string select line and the second string select line of the plurality of string select lines. The first string select line and the second string select line each have opposite sides including the first side and the second side such that the first side is closer to the third bit line end than to the fourth bit line end.

The second bit line conductor intersects a third subset of the plurality of pillars that intersect the second string select line. The third subset of the pillars includes a third pillar closest to the first side of the second string select line out of the pillars in the third subset of the pillars.

A third distance is between the third pillar and the first side of the second string select line. The first distance and the third distance are equal.

In one embodiment of the technology, the first bit line conductor and the second bit line conductor are adjacent.

"Lateral" dimensions refer to dimensions of the structure which are generally parallel to a substrate. The dimension "vertical" dimension refers to the dimension of the structure which is generally perpendicular to the substrate. In addition, layers which are termed "above" or "below" other layers, can in various embodiments be separated from such other layers by one or more intervening layers. If no intervening layer is intended, then the terms such as "immediately above" or "immediately below" are used herein. The same interpretation is intended for layers described as "superposing", "underlying" or "over" another layer.

Two items are "adjacent" to each other if they are not separated by another item of the same type. For example, two SSLs are considered "adjacent" to each other if there is no intervening SSL between them, even if the two SSLs do not touch each other. Immediate adjacency is not required by the term "adjacent" unless called for explicitly.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A memory device, comprising:
    an array of vertical NAND strings disposed below a set of bit lines, the bit lines extending in a bit line direction;
    string select lines and word lines of the vertical NAND strings comprising conductive strips configured in layers; and
    vertical NAND strings in the array extending through the layers of conductive strips, and including pages of NAND strings, NAND strings in a given page being coupled with the conductive strip of a corresponding single string select line for the given page, the NAND strings in each page being disposed in a grid that is tilted by an off-angle relative to the bit line direction, wherein the conductive strips of the string select lines have curved sides.

2. The memory device of claim 1, wherein the conductive strips of the plurality of word lines have curved sides.

3. The memory device of claim 1, wherein the vertical NAND strings in the array have ground select switches comprising conductive strips in the layers of conductive strips, and the conductive strips of the ground select switches have curved sides.

4. The memory device of claim 1, wherein first and second pages of pillars are coupled with respective first and second string select lines adjacent to one another and comprising conductive strips having facing curved sides;
- the set of bit lines superposing the first and second pages of NAND strings having a bit line pitch, each of the bit lines in the set being connect to only one NAND string in each of the first and second pages;
- wherein the grids of the first and second pages are regular grids, each respective regular grid having two perpendicular lateral dimensions that are rotated by respective acute and obtuse off-angles relative to the bit line direction, and having lateral pitches on the two perpendicular lateral dimensions, so that the bit line pitch is less than the lateral pitch of the NAND strings in the obtuse off-angle lateral dimension;
- wherein the first page of NAND strings includes a first outer set of NAND strings disposed in a first undulating line crossing the bit line direction resulting from the off-angles, and the curved side of the conductive strip of the first string select line being a first curved side between the first and second string select lines following the first undulating line; and
- wherein the second page of NAND strings includes a second outer set of NAND strings disposed in a second undulating line crossing the bit line resulting from the off-angles, and the curved side of the conductive strip of the second string select line being a second curved side between the first and second string select lines following the second undulating line.

5. The memory device of claim 1, wherein:
- the grid of a first page in the pages of NAND strings having a first set of outer NAND strings disposed in a first undulating line having at least one crest and at least one trough relative to a first line orthogonal to the bit line direction, and having a second set of outer NAND strings disposed in a second undulating line having at least one crest and at least one trough relative to a second line orthogonal to the bit line direction;
- the grid of a second page in the pages of NAND strings having a third set of outer NAND strings disposed in a third undulating line on a side of the grid adjacent the grid of the first page, and having at least one crest and at least one trough relative to a third line orthogonal to the bit line direction, and having a fourth set of outer NAND strings disposed in a fourth undulating line having at least one crest and at least one trough relative to a fourth line orthogonal to the bit line direction; and
- wherein the first and second pages of NAND strings are disposed so that a NAND string at the crest in the first undulating line in the first page is connected to a particular bit line in the set of bit lines, and the NAND string at the crest in the third undulating line in the second page is connected to the particular bit line.

6. The memory device of claim 1, wherein:
- the grid of a first page in the pages of NAND strings having a first set of outer NAND strings disposed in a first undulating line having at least one crest and at least one trough relative to a first line orthogonal to the bit line direction, and having a second set of outer NAND strings disposed in a second undulating line having at least one crest and at least one trough relative to a second line orthogonal to the bit line direction;
- the grid of a second page in the pages of NAND strings having a third set of outer NAND strings disposed in a third undulating line on a side of the grid adjacent the grid of the first page, and having at least one crest and at least one trough relative to a third line orthogonal to the bit line direction, and having a fourth set of outer NAND strings disposed in a fourth undulating line having at least one crest and at least one trough relative to a fourth line orthogonal to the bit line direction; and
- wherein the first and second pages of NAND strings are disposed so that a NAND string at the crest in the first undulating line in the first page is connected to a particular bit line in the set of bit lines, and the NAND string at the crest in the fourth undulating line in the second page is connected to the particular bit line.

7. The memory device of claim 1, including:
- the grid of a first page in the pages of NAND strings having a first set of outer NAND strings disposed in a first undulating line having at least one crest and at least one trough relative to a first line orthogonal to the bit line direction, and having a second set of outer NAND strings disposed in a second undulating line having at least one crest and at least one trough relative to a second line orthogonal to the bit line direction;
- the grid of a second page in the pages of NAND strings having a third set of outer NAND strings disposed in a third undulating line on a side of the grid adjacent the grid of the first page, and having at least one crest and at least one trough relative to a third line orthogonal to the bit line direction, and having a fourth set of outer NAND strings disposed in a fourth undulating line having at least one crest and at least one trough relative to a fourth line orthogonal to the bit line direction; and
- wherein the first and second pages of NAND strings are disposed so that a NAND string at the crest in the first undulating line in the first page is connected to a particular bit line in the set of bit lines, and the NAND string at the trough in the third undulating line in the second page is connected to the particular bit line.

8. The memory device of claim 1, wherein:
- the NAND strings in each page being disposed in a regular grid that is tilted by said off-angle relative to the bit line direction, the regular grid having a regular pitch in a direction tilted by said off-angle from the bit line direction; and
- the regular grids of first and second adjacent pages being offset from the regular pitch in a direction perpendicular to the bit line direction.

9. The memory device of claim 1, wherein:
- the NAND strings in each page being disposed in a regular grid that is tilted by said off-angle relative to the bit line direction, the regular grid having a regular pitch in a direction tilted by said off-angle from the bit line direction; and
- the regular grids of first and second adjacent pages being offset from the regular pitch in the bit line direction.

10. The memory device of claim 1, wherein:
- the NAND strings in each page being disposed in a regular grid that is tilted by said off-angle relative to the bit line direction, the regular grid having a regular pitch in a direction tilted by said off-angle from the bit line direction; and
- the regular grids of first and second adjacent pages being offset from the regular pitch in the bit line direction and in a direction perpendicular to the bit line direction.

11. A memory device on a substrate, comprising:
- a multilevel stack of conductive strips;
- a plurality of pillars extending through the multilevel stack;
- memory cells located at cross-points between the pillars and the conductive strips in the multilevel stack;

first and second string select strips above the multilevel stack of conductive strips, a first page of pillars in the plurality of pillars extending through the first string select strip, and a second page of the pillars in the plurality of pillars extending through the second string select strip;

string select gates located at cross-points between the pillars and the first and second string select strips; and a plurality of bit line conductors above the first and second string select strips, and having a bit line pitch, each of the bit line conductors connect to one corresponding pillar in each of the first and second pages, wherein:

the pillars in the first and second pages are arranged on respective regular grids, each respective regular grid having two perpendicular lateral dimensions that are rotated by respective acute and obtuse off-angles relative to the bit line direction, and having lateral pitches on the two perpendicular lateral dimensions, so that the bit line pitch is less than the lateral pitch of the pillars in the obtuse off-angle lateral dimension;

the respective regular grids are offset in a direction perpendicular to the bit line direction;

the first page of pillars includes a first outer set of pillars disposed in a first undulating line crossing the bit line direction resulting from the off-angles, and the first string select strip has a first side between the first and second string select strips with a first undulating shape following the first undulating line; and the second page of pillars includes a second outer set of pillars disposed in a second undulating line crossing the bit line resulting from the off-angles, and the second string select strip has a second side between the first and second string select strips with a second undulating shape following the second undulating line.

12. The memory device of claim 11, wherein the first undulating line has at least one crest pillar on a crest relative to a first line orthogonal to the bit line direction, and at least one trough pillar on a trough relative to the first line orthogonal to the bit line direction, and the second undulating line has at least one crest pillar on a crest relative to a second line orthogonal to the bit line direction, and at least one trough pillar on a trough relative to the second line orthogonal to the bit line direction, and wherein the first and second pages of pillars are disposed so that the crest pillar in the first undulating line in the first page is connected to a particular bit line in the plurality of bit line conductors, and the crest pillar in the second undulating line in the second page is connected to the particular bit line.

13. The memory device of claim 11, wherein the second page of pillars includes a third outer set of pillars disposed in a third undulating line orthogonal to the bit line direction resulting from the off-angles, and the second string select strip has a side opposite the second side following the third undulating line, and wherein:

the first undulating line has at least one crest pillar on a crest relative to a first line orthogonal to the bit line direction, and at least one trough pillar on a trough relative to the first line orthogonal to the bit line direction, and the third undulating line has at least one crest pillar on a crest relative to a third line orthogonal to the bit line direction, and at least one trough pillar on a trough relative to the third line orthogonal to the bit line direction; and the first and second pages of pillars are disposed so that the crest pillar in the first undulating line in the first page is connected to a particular bit line in the plurality of bit line conductors, and the crest pillar in the third undulating line in the second page is connected to the particular bit line.

14. The memory device of claim 11, wherein the conductive strips in the multilevel stack of conductive strips have respective sides with undulating shapes on at least one side of the multilayer stack.

15. The memory device of claim 11, including a ground select conductive strip beneath the multilayer stack of conductive strips, including at least one of the first page of pillars and the second page of pillars in the plurality of pillars extending through the ground select conductive strip, and wherein the ground select conductive strip has a side with an undulating shape.

16. The memory device of claim 11, including a source line conductor beneath the multilayer stack, and connected to at least the first page of pillars, and a contact structure adjacent the first page, extending to the source line conductor, the contact structure having at least one side with an undulating shape.

17. A method of manufacturing a memory device, comprising:

forming an array of vertical NAND strings disposed below a set of bit lines, the bit lines extending in a bit line direction;

forming string select lines and word lines of the vertical NAND strings comprising conductive strips configured in layers;

configuring the vertical NAND strings in the array extending through the layers of conductive strips, into pages of NAND strings, NAND strings in a given page being coupled with the conductive strip of a corresponding single string select line for the given page, the NAND strings in each page being disposed in a grid that is tilted by an off-angle relative to the bit line direction; and forming curved sides on the conductive strips of the string select lines.

18. The method of claim 17, forming curved sides on the conductive strips of the plurality of word lines.

19. The method of claim 17, wherein the vertical NAND strings in the array have ground select switches comprising conductive strips in the layers of conductive strips, and forming curved sides on the conductive strips of the ground select lines.

20. The method of claim 17, including:

disposing the NAND strings in each page in a regular grid that is tilted relative to the bit line direction, the regular grid having a regular pitch in a direction tilted from the bit line direction; and offsetting the regular grids of first and second adjacent pages from the regular pitch.

* * * * *